US011004676B2

(12) United States Patent
Ogawa et al.

(10) Patent No.: US 11,004,676 B2
(45) Date of Patent: May 11, 2021

(54) METHOD FOR MANUFACTURING SEMICONDUCTOR DEVICE, NON-TRANSITORY COMPUTER-READABLE RECORDING MEDIUM, AND SUBSTRATE PROCESSING APPARATUS

(71) Applicant: KOKUSAI ELECTRIC CORPORATION, Tokyo (JP)

(72) Inventors: Arito Ogawa, Toyama (JP); Yukinao Kaga, Toyama (JP); Kazuhiro Harada, Toyama (JP); Motomu Degai, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/135,572

(22) Filed: Sep. 19, 2018

(65) Prior Publication Data

US 2019/0096663 A1 Mar. 28, 2019

Related U.S. Application Data

(63) Continuation-in-part of application No. PCT/JP2016/060651, filed on Mar. 31, 2016.

(51) Int. Cl.
*H01L 21/02* (2006.01)
*C23C 16/36* (2006.01)
(Continued)

(52) U.S. Cl.
CPC ........ *H01L 21/02186* (2013.01); *C23C 16/34* (2013.01); *C23C 16/36* (2013.01);
(Continued)

(58) Field of Classification Search
None
See application file for complete search history.

(56) References Cited

U.S. PATENT DOCUMENTS

2001/0034097 A1   10/2001   Lim et al.
2007/0048455 A1   3/2007   Koh et al.
(Continued)

FOREIGN PATENT DOCUMENTS

JP    11-172438 A    6/1999
JP    2009-004786 A    1/2009
(Continued)

OTHER PUBLICATIONS

International Search Report for PCT/JP2016/060651, dated Jul. 12, 2016.

*Primary Examiner* — Bradley Smith
(74) *Attorney, Agent, or Firm* — Volpe Koenig

(57) ABSTRACT

A method for improving a film formation rate and forming a film having a high dry etching resistance is disclosed. The method includes forming a metal nitride layer containing the metal element and the nitrogen element by performing a predetermined number of times in a time division manner supplying a halogen-based source gas containing the metal element to the substrate and supplying a reaction gas containing the nitrogen element and reacting with the metal element to the substrate; and forming a metal carbonitride layer containing the metal element, the carbon element, and the nitrogen element by performing a predetermined number of times in a time division manner supplying an organic-based source gas containing the metal element and the carbon element to the substrate and supplying the reaction gas to the substrate.

5 Claims, 10 Drawing Sheets

(51) Int. Cl.
    *C23C 16/455*    (2006.01)
    *H01L 21/3205*   (2006.01)
    *H01L 21/033*    (2006.01)
    *C23C 16/34*     (2006.01)
    *H01L 21/308*    (2006.01)

(52) U.S. Cl.
    CPC .. *C23C 16/45525* (2013.01); *C23C 16/45531* (2013.01); *C23C 16/45561* (2013.01); *H01L 21/0228* (2013.01); *H01L 21/0332* (2013.01); *H01L 21/0338* (2013.01); *H01L 21/3081* (2013.01); *H01L 21/32051* (2013.01)

(56) References Cited

U.S. PATENT DOCUMENTS

| | | | |
|---|---|---|---|
| 2008/0317972 | A1 | 12/2008 | Hendriks et al. |
| 2010/0193955 | A1 | 8/2010 | Milligan et al. |
| 2011/0163452 | A1 | 7/2011 | Horii et al. |
| 2014/0342573 | A1* | 11/2014 | Hirose .................. C23C 16/36 438/761 |
| 2014/0361339 | A1* | 12/2014 | Liu .................... H01L 29/7834 257/192 |
| 2015/0325703 | A1* | 11/2015 | Zhu .................. H01L 29/40114 257/316 |

FOREIGN PATENT DOCUMENTS

| | | |
|---|---|---|
| JP | 2010-280991 A | 12/2010 |
| JP | 2011-142226 A | 7/2011 |
| JP | 2012-517101 A | 7/2012 |

\* cited by examiner

METHOD FOR MANUFACTURING SEMICONDUCTOR DEVICE, NON-TRANSITORY COMPUTER-READABLE RECORDING MEDIUM, AND SUBSTRATE PROCESSING APPARATUS

CROSS-REFERENCE TO RELATED APPLICATION

The present application is a continuation-in-part application under 35 U.S.C § 111(a) of International Application No. PCT/JP2016/060651, filed Mar. 31, 2016. The content of this application is incorporated herein by reference in its entirety.

TECHNICAL FIELD

The present disclosure relates to a method of manufacturing a semiconductor device, a non-transitory computer-readable recording medium, and a substrate processing apparatus.

RELATED ART

As semiconductor devices such as metal-oxide-semiconductor field effect transistors (MOSFETs) are highly integrated and have high performance, finer processing techniques are required. In a dry etching method which is one of etching methods used in fine processing, a film called a mask is used, a film which is not to be etched is covered with the mask, and a film which is not covered with the mask is etched. As a mask, a metal film such as TiN may be used in addition to an insulating film such as SiN, Poly-Si, or $SiO_2$, which is called a resist or a hard mask (Patent Literature 1).

CITATION LIST

Patent Literature

Patent Literature 1: JP 2011-6783 A

SUMMARY

Technical Problem

As a characteristic of the hard mask, high dry etching resistance is required. In order to maintain the dry etching resistance, a certain film thickness is required. However, since the throughput decreases as the film thickness increases, a technique for improving the film formation rate is required. On the other hand, a technique for achieving deep holes and high aspect ratios is required due to miniaturization in recent years, and a technique for processing thin and deep holes is required for a dry etching technique. However, it is difficult to form deep holes having a high aspect ratio with straight directivity. Since the aspect ratio becomes lower as the hard mask becomes thinner, a thinner hard mask is required. However, in some cases, if the hard mask is thinned, the mask maybe etched by dry etching.

The present disclosure is to provide a technique capable of improving a film formation rate and forming a film having a high dry etching resistance.

Solution to Problem

According to one aspect of the present disclosure, there is provided a technique including a process of forming a metal carbonitride film containing a metal element, a carbon element, and a nitrogen element on a substrate by performing a predetermined number of times in a time division manner: a process of forming a metal nitride layer containing the metal element and the nitrogen element by performing a predetermined number of times in a time division manner a process of supplying a halogen-based source gas containing the metal element to the substrate and a process of supplying a reaction gas containing the nitrogen element and reacting with the metal element to the substrate; and a process of forming a metal carbonitride layer containing the metal element, the carbon element, and the nitrogen element by performing a predetermined number of times in a time division manner a process of supplying an organic-based source gas containing the metal element and the carbon element to the substrate and a process of supplying the reaction gas to the substrate, wherein a ratio of the number of times of performing the process of forming the metal nitride layer and the number of times of performing the process of forming the metal carbonitride layer are controlled so that a carbon concentration contained in the metal carbonitride film is set to 5 to 50%.

Advantageous Effects of Disclosure

According to the present disclosure, it is possible to form a film capable of improving a film formation rate and having a high dry etching resistance.

DESCRIPTION OF EMBODIMENTS

In order to promote thinning by forming a film having a high dry etching resistance and improve the film formation rate at the time of forming a film having a required thickness, the inventors intensively studied. As a result, it was found that the dry etching resistance of the film is improved by adding an element (for example, carbon (C)) having a property of being hard to be bonded to a halide contained in an etching gas used at the time of dry etching to a film (for example, a titanium nitride film (TiN film)) used as a hard mask. Furthermore, it was found that the dry etching resistance of the film can be tuned by adjusting the C concentration in the film. For example, the higher the C concentration in the film, the higher the dry etching resistance of the film, and the lower the C concentration in the film, the lower the dry etching resistance of the film. The TiN film to which C is added is referred to as a TiCN film, a Ti (C) N film, a C-doped TiN film, or the like.

As a method of adding C, a film is formed by using an organic-based titanium-containing source material containing C and a non-organic-based (for example, inorganic-based) titanium-containing source material containing C as a titanium-containing source material at the time of forming the film. By changing the ratio of the number of times of supply of the organic-based titanium-containing source material and the number of times of supply of the non-organic-based titanium-containing source material, the supply method, or the like, it is possible to adjust the C concentration in the film. In addition, the inventors have found that, compared with a case where a TiN film or a TiCN film is formed by using just one of a nitriding gas, an organic-based titanium-containing source material, and a non-organic-based titanium-containing source material, in a case where the TiCN film is formed by using both thereof, the film formation rate can be made faster.

In this manner, by adding to the film an element having a property of being hard to be bonded to the halide contained in the etching gas used at the time of dry etching, it becomes possible to improve the dry etching resistance of the film. As a method of adding to the film an element having a property of being hard to be bonded to the halide, by combining and bonding a source material containing an element having a property of being hard to be bonded to the halide and a source material not containing the element, it is possible to improve the film formation rate of the film. Details thereof are described below.

First Embodiment of the Present Disclosure

Hereinafter, a first preferred embodiment of the present disclosure will be described with reference to FIGS. 1 to 3. A substrate processing apparatus 10 is configured as an example of an apparatus used in a substrate processing step which is one step of a manufacturing process of a semiconductor device (a device).

(1) Configuration of Processing Furnace

Figure 1:
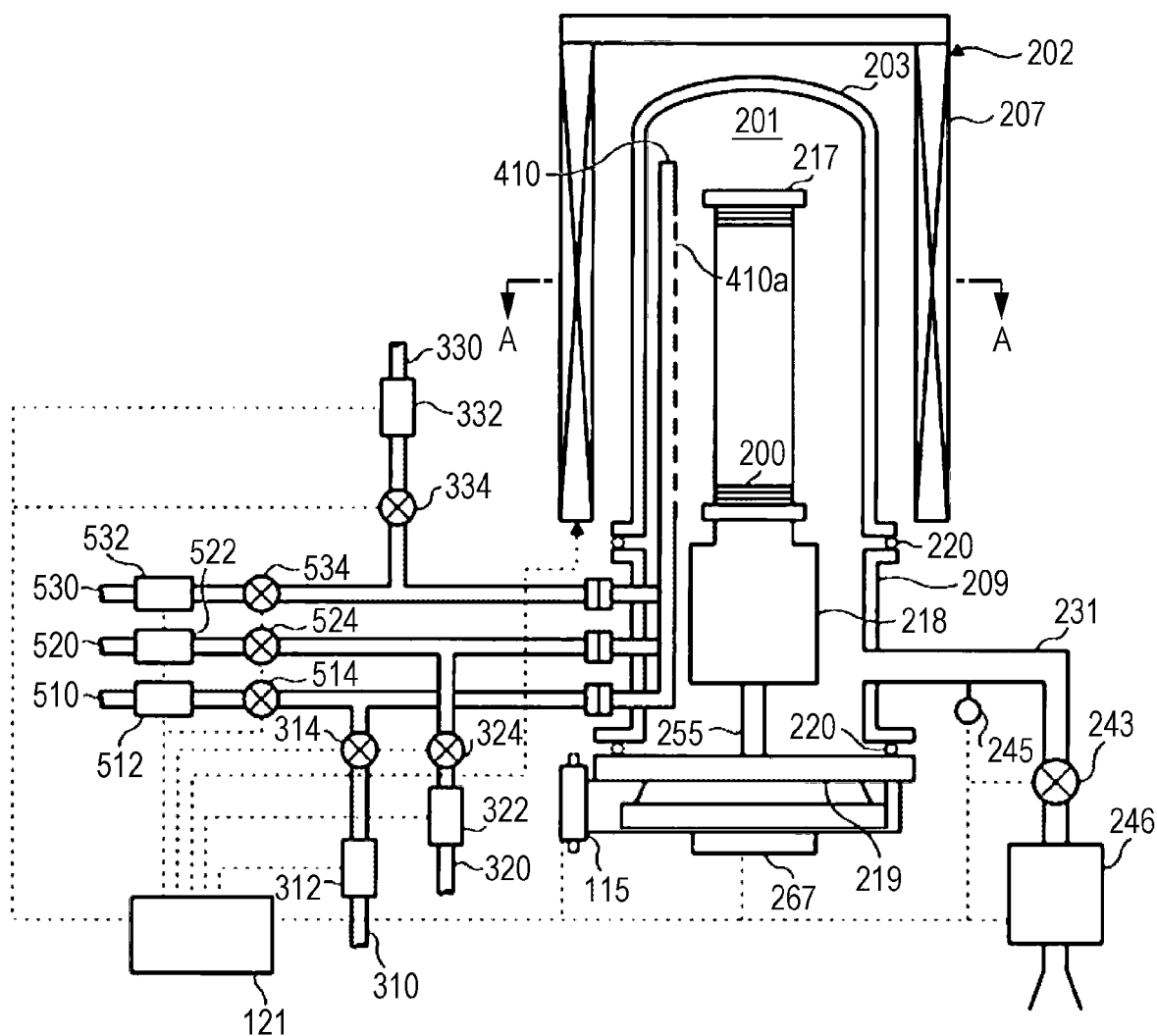
FIG. 1 is a schematic configuration diagram of a processing furnace of a substrate processing apparatus appropriately used in an embodiment of the present disclosure and illustrates a processing furnace portion in a longitudinal sectional view.
Figure 2:
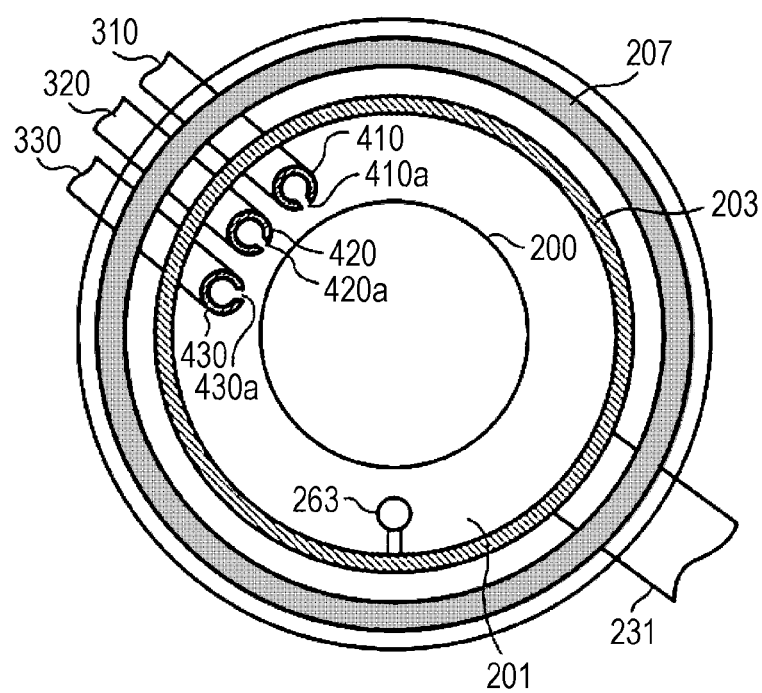
FIG. 2 is a cross-sectional view taken along line A-A of FIG. 1.

As illustrated in FIG. 1, a processing furnace 202 includes a heater 207 as a heating means (heating mechanism). The heater 207 has a cylindrical shape and is supported vertically by a heater base (not illustrated) as a holding plate.

Inside the heater 207, a reaction tube 203 constituting a reaction vessel (processing vessel) is arranged concentrically with the heater 207. The reaction tube 203 is made of a heat-resistant material (such as quartz ($SiO_2$) or a silicon carbide (SiC)) and is formed in a cylindrical shape of which upper end is closed and of which lower end is open. The processing chamber 201 is configured to be capable of accommodating wafers 200 as substrates in a state where multiple stages thereof in a horizontal posture are aligned in a vertical direction by a boat 217 to be described later.

In the processing chamber 201, nozzles 410, 420, and 430 are provided so as to penetrate the sidewall of a manifold 209. Gas supply pipes 310, 320, and 330 serving as gas supply lines are connected to the nozzles 410, 420, and 430, respectively. As described above, the reaction tube 203 is provided with three nozzles 410, 420, and 430 and the three gas supply pipes 310, 320, and 330, and a plurality of types of gases (processing gases, source materials) can be supplied to the processing chamber 201.

However, the processing furnace 202 of the present embodiment is not limited to the above-described embodiment. For example, a metallic manifold supporting the reaction tube 203 may be provided below the reaction tube 203, and each nozzle may be provided so as to penetrate through the sidewall of the manifold. In this case, an exhaust pipe 231 to be described later may be additionally provided to the manifold. Even in this case, the exhaust pipe 231 may be provided not to the manifold but to the lower portion of the reaction tube 203. As described above, the furnace inlet of the processing furnace 202 may be made of a metal, and a nozzle or the like may be attached to the metallic furnace inlet.

In the gas supply pipes 310, 320, and 330, mass flow controllers (MFCs) 312, 322, and 332 which are flow rate controllers (flow rate control portions) and valves 314, 324, and 334 which are on-off valves are provided in order from the upstream side. Gas supply pipes 510, 520, and 530 for supplying an inert gas are connected to the gas supply pipes 310, 320, and 330 at the downstream sides from the valves 314, 324, and 334, respectively. In the gas supply pipes 510, 520, and 530, MFCs 512, 522, and 523 which are flow rate controllers (flow rate control portions) and valves 514, 524, and 534 which are on-off valves are provided in order from the upstream side.

The nozzles 410, 420, and 430 are connected and coupled to the distal ends of the gas supply pipes 310, 320, and 330. The nozzles 410, 420, and 430 are configured as L-shaped long nozzles, and the horizontal portions thereof are provided so as to penetrate the sidewalls of the manifold 209. The vertical portions of the nozzles 410, 420, and 430 are arranged in an annular space formed between the inner wall of the reaction tube 203 and the wafer 200 so as to erect upwards (upwards in the stacking direction of the wafers 200) (that is, so as to erect from one end side to the other end side of the wafer arrangement region) along the inner wall of the reaction tube 203. That is, the nozzles 410, 420, and 430 are provided along the wafer arrangement region in a region horizontally surrounding the wafer arrangement region on the side of the wafer arrangement region where the wafers 200 are arranged.

Gas supply holes 410*a*, 420*a*, and 430*a* for supplying (ejecting) gases are provided on the side surfaces of the nozzles 410, 420, and 430. The gas supply holes 410*a*, 420*a*, and 430*a* are opened to face the center of the reaction tube 203. A plurality of the gas supply holes 410*a*, 420*a*, and 430*a* are provided over a range from the lower portion to the upper portion of the reaction tube 203, have the same opening area, and are further provided with the same opening pitch. However, the gas supply holes 410*a*, 420*a*, and 430*a* are not limited to the above-described embodiments. For example, the opening area may be gradually increased in the direction from the lower portion to the upper portion of the reaction tube 203. By doing so, it is possible to equalize the flow rates of the gases supplied from the gas supply holes 410*a*, 420*a*, and 430*a*.

As described above, in the present embodiment, gases are transported through the nozzles 410, 420, and 430 arranged in the annular longitudinal space formed by the inner wall of the reaction tube 203 and the ends of the plurality of wafers 200, that is, in the cylindrical space. Then, the gases are injected into the reaction tube 203 for the first time in the vicinity of the wafer 200 from the gas supply holes 410a, 420a, and 430a opened in the nozzles 410, 420, and 430, respectively. Then, the main flow of the gases in the reaction tube 203 is set to be in a direction parallel to the surface of the wafer 200, that is, in the horizontal direction. With such a configuration, the gases can be uniformly supplied to each wafer 200, and thus, the film thickness uniformity of the thin film formed on each wafer 200 can be improved. The gas flowing on the surface of the wafer 200, that is, the residual gases after the reaction are allowed to flow toward an exhaust outlet, that is, in the direction of the exhaust pipe 231 described later. However, the direction of the flow of the residual gas is appropriately specified depending on the position of the exhaust outlet, but the direction is not limited to the vertical direction.

A processing gas, a first source gas (first metal-containing gas) containing a metal element and containing no carbon (C) from the gas supply pipe 310 is supplied into the processing chamber 201 through the MFC 312, the valve 314, and the nozzle 410. As the first source material, for example, titanium tetrachloride ($TiCl_4$) as a metal source material containing titanium (Ti) as a metal element and containing no carbon (C), that is, a halogen-based source material (halide, also referred to as a halogen-based titanium source material) as an inorganic-metal-based source material (inorganic metal compound) is used. Ti is classified as a transition metal element. In addition, the halogen-based source material is a source material containing a halogen group. Halogen groups include a chloro group, a fluoro group, a bromo group, an iodo group, and the like. That is, the halogen group includes halogen elements such as chlorine (Cl), fluorine (F), bromine (Br), and iodine (I). In this specification, a case where the term "source material" is used may include a case that the term denotes a "liquid source material in a liquid state", a case that the term denotes a "source gas in a gaseous state", or a case that term denotes both.

As a processing gas, a second source gas (second metal-containing gas) containing a metal element and C from the gas supply pipe 320 is supplied into the processing chamber 201 through the MFC 322, the valve 324, and the nozzle 420. As the second source material, for example, tetrakis dimethylamino titanium (TDMAT, $Ti[N(CH_3)_2]_4$) as a (C-containing) metal source material containing Ti as a metal element and containing C, that is, an organic source material (organic metal compound, organic titanium source material) is used.

As a processing gas, an N-containing gas as a reaction gas (reactant) containing nitrogen (N) from the gas supply pipe 330 is supplied into the processing chamber 201 through the MFC 332, the valve 334, and the nozzle 430. As the N-containing gas, an N-containing gas containing no metal element, for example, an ammonia ($NH_3$) gas may be used.

As the inert gas, for example, the nitrogen ($N_2$) gas from the gas supply pipes 510, 520, and 530 is supplied to the processing chamber 201 through the MFCs 512, 522, and 532, the valves 514, 524, and 534, the nozzles 410, 420, and 430. The inert gas supplied from the gas supply pipes 510, 520, and 530 functions as a purge gas, a dilution gas, or a carrier gas in a substrate processing step described later.

In the case of using a compound that is in a liquid state at normal temperature and normal pressure such as $TiCl_4$ or TDMAT as a processing gas, the liquid-state $TiCl_4$ or TDMAT is vaporized by a vaporization system such as a vaporizer or a bubbler, and thus, a $TiCl_4$ gas or a TDMAT gas is supplied into the processing chamber 201.

A processing gas supply system is mainly configured with the gas supply pipes 310, 320, and 330, the MFCs 312, 322, and 332 and the valves 314, 324, and 334. It maybe considered that the nozzles 410, 420, and 430 are included in the processing gas supply system. The processing gas supply system may be simply referred to as a gas supply system.

In the case of flowing the metal-containing gas as the source gas as described above from the gas supply pipes 310 and 320, a metal-containing gas supply system as the source gas supply system is mainly configured with the gas supply pipes 310 and 320, the MFCs 312 and 322, and the valves 314 and 324. It may be considered that the nozzles 410 and 420 are included in the source gas supply system. The source gas supply system may also be referred to as a source material supply system.

In the case of flowing the inorganic metal-based source gas as the source gas from the gas supply pipe 310, an inorganic metal-based source gas supply system is mainly configured with the gas supply pipe 310, the MFC 312, and the valve 314. It may be considered that the nozzle 410 is included in the inorganic metal-based source gas supply system. The inorganic metal-based source gas supply system may also be referred to as an inorganic metal-based source material supply system. In the case of flowing a halogen-based source gas as an inorganic metal-based source gas, the inorganic metal-based source gas supply system may be referred to as a halogen-based source gas supply system. The halogen-based source gas supply system may also be referred to as a halogen-based source material supply system. In the case of flowing a $TiCl_4$ gas from the gas supply pipe 310, the halogen-based source gas supply system may also be referred to as a $TiCl_4$ gas supply system. The $TiCl_4$ gas supply system may also be referred to as a $TiCl_4$ supply system.

In the case of flowing the organic-based source gas as the source gas from the gas supply pipe 320, an organic-based source gas supply system is mainly configured with the gas supply pipe 320, the MFC 322, and the valve 324. It may be considered that the nozzle 420 is included in the organic-based source gas supply system. The organic-based source gas supply system may also be referred to as an organic-based source material supply system. In the case of flowing the TDMAT gas from the gas supply pipe 320, the organic-based source gas supply system may also be referred to as a TDMAT gas supply system. The TDMAT gas supply system may also be referred to as a TDMAT supply system.

In the case of flowing the N-containing gas as the reaction gas from the gas supply pipe 330, an N-containing gas supply system as a reaction gas supply system is mainly configured with the gas supply pipe 330, the MFC 332, and the valve 334. It may be considered that the nozzle 430 is included in the reaction gas supply system. In the case of flowing the $NH_3$ gas from the gas supply pipe 330, the reaction gas supply system may also be referred to as an $NH_3$ gas supply system. The reaction gas supply system may also be referred to as an $NH_3$ supply system.

In addition, an inert gas carrier gas supply system is mainly configured with gas supply pipes 510, 520, and 530, MFCs 512, 522, and 523 and valves 514, 524, and 534. The inert gas supply system may also be referred to as a carrier gas supply system. Since this inert gas also functions as a purge gas, the inert gas supply system may also be referred to as a purge gas supply system.

An exhaust pipe 231 for exhausting the atmosphere in the processing chamber 201 is provided in the reaction tube 203. The exhaust pipe 231 is connected to a pressure sensor 245 as a pressure detector (pressure detection portion) for detecting the internal pressure of the processing chamber 201 and a vacuum pump 246 as a vacuum evacuation device through an auto pressure controller (APC) valve 244 as a pressure regulator (pressure regulation portion). The APC valve 244 can perform vacuum evacuation and stop vacuum evacuation in the processing chamber 201 by opening and closing valves in the state where the vacuum pump 246 is operated. Furthermore, the APC valve 244 is a valve configured to be able to regulate the internal pressure of the processing chamber 201 by controlling a valve opening degree on the basis of the pressure information detected by the pressure sensor 245 in the state where the vacuum pump 246 is operated. An exhaust system is mainly configured with the exhaust pipe 231, the APC valve 244, and the pressure sensor 245. It may be considered that the vacuum pump 246 is included in the exhaust system.

A seal cap 219 as a furnace inlet lid capable of air tightly closing the lower end opening of the reaction tube 203 is provided below the reaction tube 203. The seal cap 219 is configured to be in contact with the lower end of the reaction tube 203 from the lower side in the vertical direction. The seal cap 219 is made of a metal such as SUS, for example, and is formed in a disc shape. On the upper surface of the seal cap 219, an O-ring 220 as a seal member which is in contact with the lower end of the reaction tube 203 is provided. On the side of the seal cap 219 opposite to the processing chamber 201, a rotation mechanism 267 for rotating a boat 217 described later is provided. A rotating shaft 255 of the rotation mechanism 267 penetrates the seal cap 219 and is connected to the boat 217. The rotation mechanism 267 is configured to rotate the wafer 200 by rotating the boat 217. The seal cap 219 is configured to be lifted up and down in the vertical direction by a boat elevator 115 as a lifting mechanism provided vertically outside the reaction tube 203. The boat elevator 115 is configured so that the boat 217 can be carried into and out of the processing chamber 201 by lifting the seal cap 219 up and down. In other words, the boat elevator 115 is configured as a carrying device (carrying mechanism) that carries the boat 217, that is, the wafer 200, into and out of the processing chamber 201.

The boat 217 as a substrate support tool is configured so as to support a plurality of wafers 200, for example, 25 to 200 wafers 200 in multiple stages being aligned in vertical direction in a horizontal posture and in a state where the centers thereof are aligned, that is, so as to arrange the wafers at intervals. The boat 217 is made of a heat-resistant material such as quartz or SiC. Below the boat 217, a heat insulating plate 218 made of a heat-resistant material such as quartz or SiC is supported in multiple stages in a horizontal posture. With this configuration, heat from the heater 207 is less likely to be transmitted to the seal cap 219 side. However, the present embodiment is not limited to the above-described embodiment. For example, a heat insulating cylinder configured as a tubular member made of a heat-resistant material such as quartz or SiC may be provided without providing the heat insulating plate 218 under the boat 217.

A temperature sensor 263 as a temperature detector is configured to be provided inside the reaction tube 203, and by adjusting the amount of electricity supplied to the heater 207 on the basis of temperature information detected by the temperature sensor 263, the temperature inside the processing chamber 201 is has a desired temperature distribution. Like the nozzles 410, 420, and 430, the temperature sensor 263 is configured in an L shape and is provided along the inner wall of the reaction tube 203.

Figure 3:
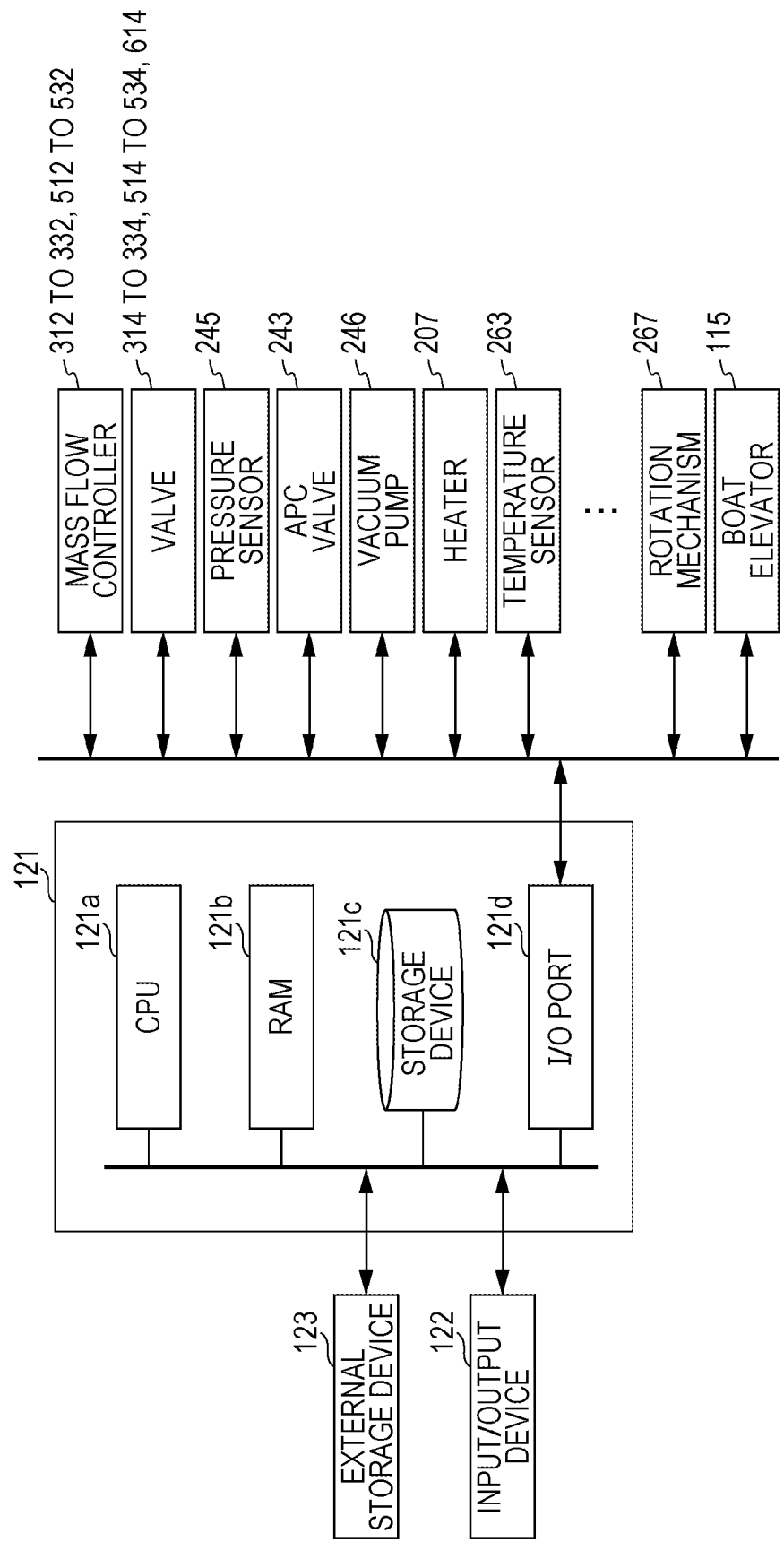
FIG. 3 is a block diagram illustrating a configuration of a controller included in the substrate processing apparatus illustrated in FIG. 1.

As illustrated in FIG. 3, the controller 121 as a control portion (control means) is configured as a computer including a central processing unit (CPU) 121a, a random access memory (RAM) 121b, a storage device 121c, and an I/O port 121d. The RAM 121b, the storage device 121c, and the I/O port 121d are configured to exchange data with the CPU 121a via an internal bus. An input/output device 122 configured as, for example, a touch panel or the like is connected to the controller 121.

The storage device 121c is configured with, for example, a flash memory, a hard disk drive (HDD), and the like. A control program for controlling the operation of the substrate processing apparatus, a process recipe in which procedures, conditions, and the like of substrate processing to be described later are written, and the like are readably stored in the storage device 121c. The process recipe is such a combination of the respective procedures in a substrate processing step described later that are executed by the controller 121 so as to be capable of obtaining a predetermined result and functions as a program. Hereinafter, this process recipe, the control program, and the like are collectively referred to simply as a program. In this specification, a case where the term "program" is used may include a case where a process recipe alone is included, a case where a control program alone is included, or a case where both are included. The RAM 121b is configured as a memory area (work area) in which programs, data, and the like read by the CPU 121a are temporarily retained.

The I/O port 121d is connected to the MFCs 312, 322, 332, 512, 522, and 532, the valves 314, 324, 334, 514, 524, and 534, the APC valve 243, the pressure sensor 245, the vacuum pump 246, the heater 207, the temperature sensor 263, the rotation mechanism. 267, the boat elevator 115, and the like.

The CPU 121a reads and executes the control program from the storage device 121c and reads the process recipe from the storage device 121c in response to an input of an operation command from the input/output device 122 or the like. According to the read process recipe, the CPU 121a is configured so as to control flow rate adjustment operations of various gases by the MFCs 312, 322, 332, 512, 522, and 532, opening/closing operations of the valves 314, 324, 334, 514, 524, and 534, and opening/closing operations of the APC valve 243, a pressure regulation operation based on the pressure sensor 245 by the APC valve 243, a temperature adjustment operation of the heater 207 based on the temperature sensor 263, start and stop of the vacuum pump 246, rotation and rotation speed adjustment operations of the boat 217 by the rotation mechanism 267, lifting up/down operations of the boat 217 by the boat elevator 115, and the like.

The controller 121 is not limited to a case where the controller is configured as a dedicated computer, but the controller may be configured as a general-purpose computer. For example, the controller 121 of the present embodiment may be configured by preparing an external storage device (for example, a magnetic tape, a magnetic disk such as a flexible disk or a hard disk, an optical disk such as a CD or a DVD, a magneto-optical disk such as an MO, a semiconductor memory such as a USB memory or a memory card) 123 that stores the above-described program and by installing the program in a general-purpose computer by using the external storage device 123. However, the means for supplying the program to the computer is not limited to a case where the program is supplied through the external storage device 123. For example, a communication means such as the Internet or a dedicated line may be used to supply the program instead of the external storage device 123. The storage device 121c and the external storage device 123 are configured as a computer-readable recording medium. Hereinafter, these are collectively referred to simply as a recording medium. In this specification, a case where the term "recording medium" is used may include a case where the storage device 121c alone is included, a case where the external storage device 123 alone is included, or a case where both are included.

(2) Substrate Processing Step (Film Forming Process)

An example of a process of forming a metal film as a hard mask on a substrate will be described as one process of a manufacturing process of a semiconductor device (device). The process of forming the metal film is performed by using the processing furnace 202 of the substrate processing apparatus 10 described above. In the following description, the operation of each component constituting the substrate processing apparatus 10 is controlled by the controller 121.

Figure 4:
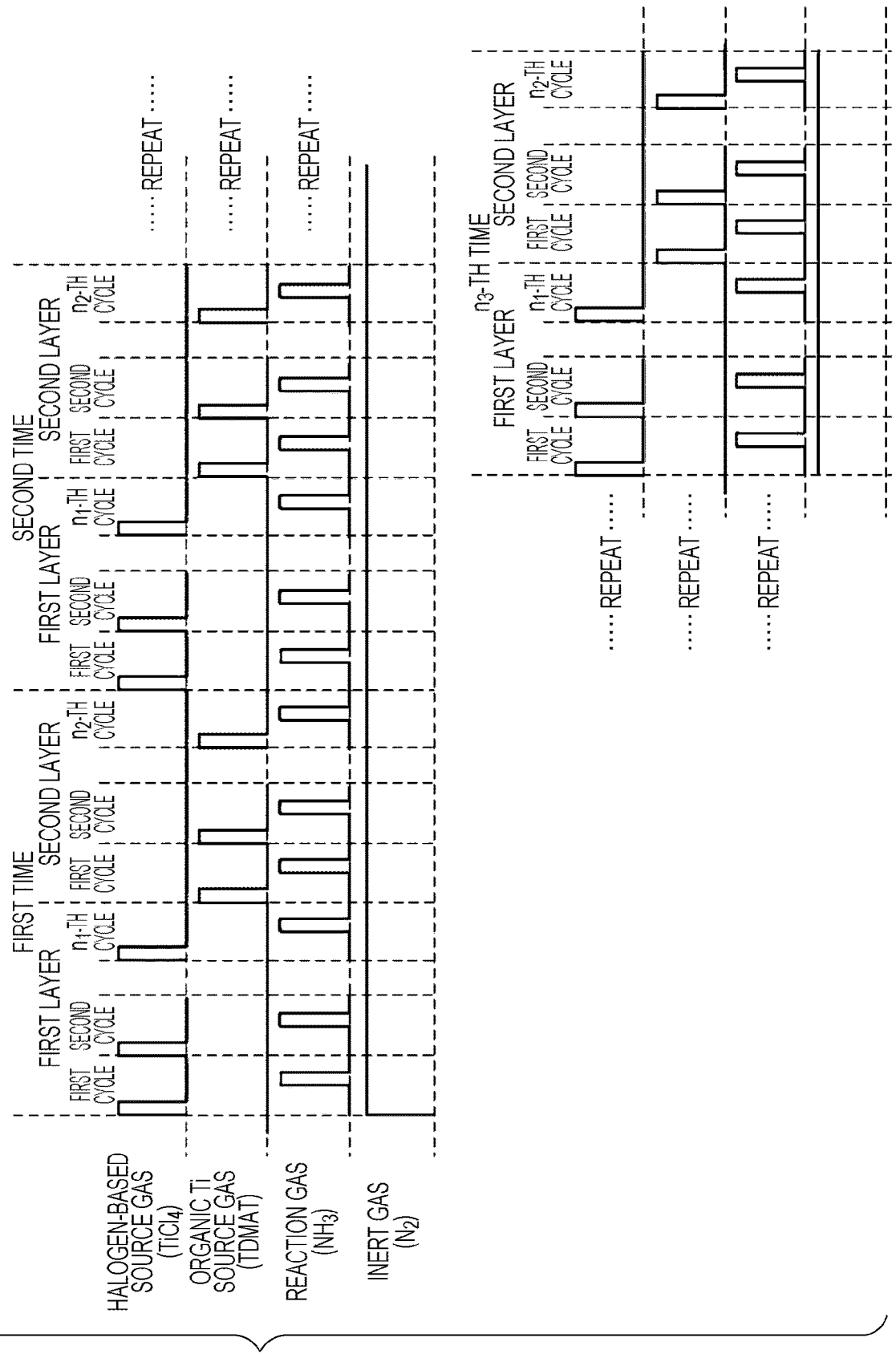
FIG. 4 is a diagram illustrating a sequence in a first embodiment of the present disclosure.
Figure 5A:
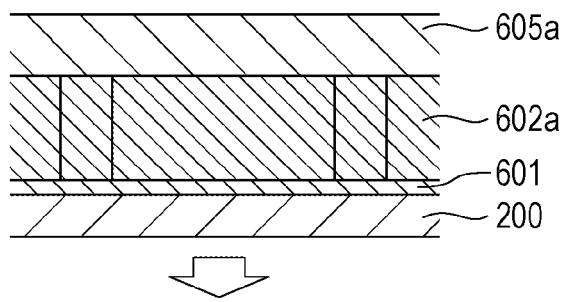
FIG. 5A-F are an example of a process sequence for forming a Si pattern on a wafer.
Figure 5B:
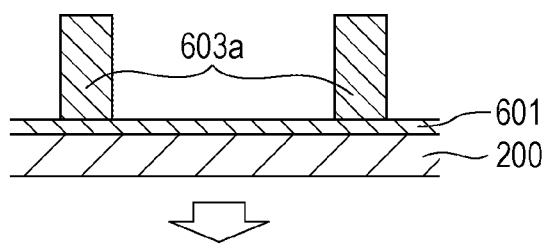
Figure 5C:
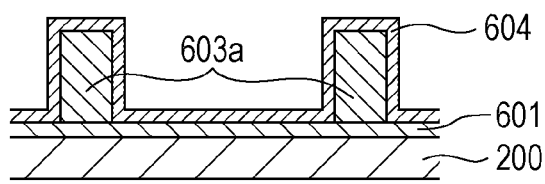
Figure 5D:
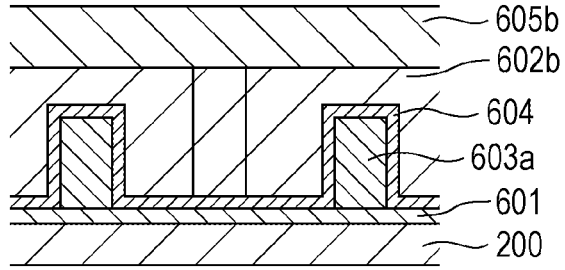
Figure 5E:
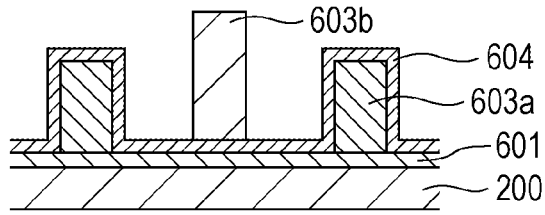
Figure 5F:
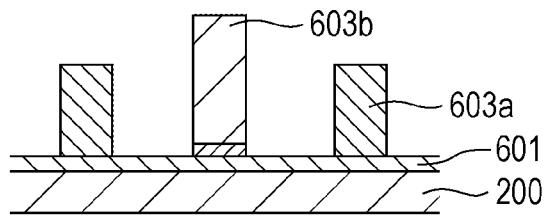

The present embodiment will be described with reference to FIG. 4. A preferred film formation sequence (sometimes, simply referred to as a sequence) of the present embodiment includes a process of forming a thin film (for example, a titanium nitride film (TiCN film)) containing first to third elements on a substrate by performing a predetermined number of times ($N_3$ times) in a time division manner: a process of forming a first layer (for example, a TiN layer) containing the first element and the second element on the wafer 200 by performing a predetermined number of times ($N_1$ times) in a time division manner a process of supplying a halogen-based source gas (for example, $TiCl_4$ gas) containing a metal element (for example, Ti) to the wafer 200 and a process of supplying a reaction gas (for example, $NH_3$ gas) containing a second element (for example, nitrogen (N)) and reacting with the first element to the wafer 200; and a process of forming a second layer containing the first element and the second element on the wafer 200 by performing a predetermined number of times ($N_2$ times) in a time division manner a process of supplying an organic-based source gas (for example, TDMAT gas) containing the first element and the third element (for example, carbon (C)) to the wafer 200 and a process of supplying the reaction gas to the wafer 200.

In this specification, the above-described sequence may be indicated as follows.

$((TiCl_4 \rightarrow NH_3) \times n_1 \rightarrow (TDMAT \rightarrow NH_3) \times n_2) \times n_3 \Rightarrow TiCN$ In this specification, a case where the term "wafer" is used may include a case where the wafer denotes a "wafer itself" or a case where the wafer denotes a "laminated body (aggregated body) of a wafer and predetermined layers or films formed on the surface thereof", that is, a case where a wafer including a predetermined layer or film formed on the surface thereof is referred to as a wafer. In this specification, a case where the term "surface of the wafer" is used may include a case where the surface denotes "the surface (exposed surface) of the wafer itself" or a case where the surface denotes "the surface of a predetermined layer or film formed on the wafer, that is, a case where the surface denotes the outermost surface of a wafer as a laminated body"

Accordingly, in this specification, a case where the expression "to supply a predetermined gas to a wafer" is described may include a case where the expression denotes "to directly supply a predetermined gas to the surface (exposed surface) of the wafer itself" or a case where the expression denotes "to supply a predetermined gas to the layer or film formed on the wafer, that is, the outermost surface of the wafer as a laminated body". In addition, in this specification, a case where the expression "to form a predetermined layer (or film) on a wafer" is described may include a case where the expression denotes "to directly form a predetermined layer (or film) on the surface (exposed surface) of the wafer itself" or a case where the expression denotes "to form a predetermined layer (or film) on the layer or film formed on the wafer, that is, on the outermost surface of the wafer as a laminated body".

In addition, in this specification, a case where the term "substrate" is used is similar to a case where the term "wafer" is used, and in that case, in the above description, the "wafer" is replaced with the "substrate".

In this specification, the term "metal film" denotes a film configured with a conductive substance containing a metal atom and includes a conductive metal nitride film, a conductive metal oxide film, a conductive metal oxynitride film, a conductive metal composite film, a conductive metal alloy film, a conductive metal silicide film, a conductive metal carbide film, a conductive metal carbonitride film, and the like. In addition, the TiCN film (titanium nitride film) is a conductive metal nitride film.

(Wafer Charging and Boat Loading)

When a plurality of wafers 200 are loaded in the boat 217 (wafer charging), as illustrated in FIG. 1, the boat 217 supporting the plurality of wafers 200 is lifted up by the boat elevator 115 and is carried into the processing chamber 201 (boat loading). In this state, the seal cap 219 is in a state of closing the lower end opening of the reaction tube 203 with the O-ring 220 interposed therebetween.

(Pressure Regulation and Temperature Adjustment)

The interior of the processing chamber 201, that is, the space where the wafer 200 exists is evacuated by the vacuum pump 246 so as to have a desired pressure (degree of vacuum). At this time, the internal pressure of the processing chamber 201 is measured by the pressure sensor 245, and the APC valve 243 is feedback controlled on the basis of the measured pressure information (pressure regulation). The vacuum pump 246 maintains the state of being always operated at least until the processing on the wafer 200 is completed. In addition, the interior of the processing chamber 201 is heated by the heater 207 so as to have a desired temperature. At this time, the amount of electricity to the heater 207 is feedback-controlled (temperature adjustment) on the basis of the temperature information detected by the temperature sensor 263 so that the interior of the processing chamber 201 has a desired temperature distribution. The heating of the interior of the processing chamber 201 by the heater 207 is continuously performed at least until the processing on the wafer 200 is completed. Subsequently, the rotation of the boat 217 and the wafer 200 is started by the rotation mechanism 267. The rotation of the boat 217 and the wafer 200 by the rotation mechanism 267 is continued at least until the processing on the wafer 200 is completed.

(TiN Layer Forming Step)

Subsequently, the step of forming the TiN layer as the first layer is performed. The TiN layer forming step includes a halogen-based source gas supplying step, a residual gas removing step, an N-containing gas supplying step, and a residual gas removing step described below.

(Halogen-Based Source Gas Supplying Step)

The valve 314 is opened, and thus, the $TiCl_4$ gas, which is a halogen-based source material, is allowed to flow into the gas supply pipe 310. The flow rate of the $TiCl_4$ gas flowing through the gas supply pipe 310 is controlled by the MFC 312. The flow-rated-adjusted TiCl$_4$ gas is supplied into the processing chamber 201 from the gas supply hole 410a of the nozzle 410 and is exhausted from the exhaust pipe 231. At this time, the TiCl$_4$ gas is supplied to the wafer 200. That is, the surface of the wafer 200 is exposed to the TiCl$_4$ gas. At the same time, the valve 514 is opened, and thus, an inert gas such as N$_2$ gas is allowed to flow into the gas supply pipe 510. The flow rate of the N$_2$ gas flowing through the gas supply pipe 510 is controlled by the MFC 512. The flow-rate-adjusted N$_2$ gas is supplied into the processing chamber 201 together with the TiCl$_4$ gas and is exhausted from the exhaust pipe 231. In addition, at this time, in order to prevent the TiCl$_4$ gas from entering into the nozzle 420 and the nozzle 430, the valves 524 and 534 are opened, and thus, the N$_2$ gas is allowed to flow into the gas supply pipe 520 and the gas supply pipe 530. The N$_2$ gas is supplied into the processing chamber 201 through the gas supply pipe 320, the gas supply pipe 330, the nozzle 420, and the nozzle 430 and is exhausted from the exhaust pipe 231.

At this time, by appropriately controlling the APC valve 243, the internal pressure of the processing chamber 201 is set to, for example, a (predetermined) pressure within a range of 1 to 70000 Pa, preferably a (predetermined) pressure within a range of 1 to 1333 Pa, more preferably a (predetermined) pressure within a range of 20 to 50 Pa. If the pressure is lower than 1 Pa, there is a possibility that the film formation rate becomes too low. If the pressure is higher than 70000 Pa, there is a possibility that the residual gas cannot be sufficiently removed in the residual gas removing step described later, and impurities are taken into the TiN layer, and thus, the resistance of the TiCN film increases. In this specification, in a case where, for example, 1 to 70000 Pa is disclosed as a range of numerical values, the range denotes 1 Pa or more and 70000 Pa or less. That is, the range of numerical values includes 1 Pa and 70000 Pa. This is the same for all numerical values disclosed in this specification such as the flow rate, the time, and the temperature as well as the pressure.

The supply flow rate of the TiCl$_4$ gas controlled by the MFC 312 is set to, for example, a predetermined flow rate within a range of 0.001 to 10 slm, preferably a predetermined flow rate within a range of 0.15 to 2 slm, more preferably a predetermined flow rate with in a range of 0.3 to 0.6 slm. If the flow rate is less than 0.001 slm, there is a possibility that the film formation rate becomes too low. If the flow rate is more than 10 slm, there is a possibility that the amount of Cl as impurities taken into the TiN layer increases, and thus, the resistance of the TiCN film becomes high.

The supply flow rate of the N$_2$ gas controlled by the MFCs 512, 522, and 532 is set to, for example, a predetermined flow rate within a range of 0.001 to 20 slm, preferably a predetermined flow rate within a range of 5 to 15 slm, more preferably a predetermined flow rate within a range of 6 to 8 slm. If the flow rate is less than 0.001 slm, there is a possibility that the amount of Cl as impurities taken into the TiN layer increases, and thus, the resistance of the TiCN film becomes high. If the flow rate is more than 20 slm, there is a possibility that the film formation rate becomes too low.

The time for supplying the TiCl$_4$ gas to the wafer 200, that is, the gas supply time (irradiation time) is (predetermined) time in the range of 0.01 to 120 seconds, preferably in the range of 1 to 30 seconds (Predetermined) time within a range of 2 to 4 seconds, and more preferably (predetermined) time within a range of 2 to 4 seconds. If the supply time is shorter than 0.01 second, there is a possibility that the film formation rate becomes too low. If the supply time is longer than 120 seconds, there is a possibility that the amount of Cl as impurities taken into the TiN layer increases, and thus, the resistance of the TiCN film becomes high.

The temperature of the heater 207 is set such that the temperature of the wafer 200 is, for example, a (predetermined) temperature within a range of 200 to 600° C., preferably a (predetermined) temperature within a range of 300 to 550° C., more preferably a (predetermined) temperature within a range of 360 to 400° C. If the temperature is lower than 200° C., there is a possibility that the film formation rate becomes too low. If the temperature is higher than 600° C., there is a possibility that the influence on thermal budget increases.

By supplying the TiCl$_4$ gas to the wafer 200 under the above-described conditions, the first Ti-containing layer having a thickness of, for example, less than a one-atom layer to about a several-atom layer is formed on the wafer 200 (the underlying film on the surface). The first Ti-containing layer may be a Ti simple substance layer configured with a Ti simple substance, may be a Ti layer containing Cl, may be an adsorption layer of TiCl$_4$, or may be a composite layer thereof.

The Ti layer containing Cl is a generic term including not only a continuous layer configured with Ti and containing Cl but also a discontinuous layer or a Ti thin film containing Cl formed by overlapping these layers. In some cases, the continuous layer configured with Ti and containing Cl maybe referred to as a Ti thin film containing Cl. The Ti constituting the Ti layer containing Cl includes not only the Ti of which bond with Cl is not completely broken but also the Ti of which bond with Cl is completely broken.

The adsorption layer of TiCl$_4$ includes not only a continuous adsorption layer configured with TiCl$_4$ molecules but also a discontinuous adsorption layer. That is, the adsorption layer of TiCl$_4$ includes a one-molecular layer configured with the TiCl$_4$ molecules or an adsorption layer having a thickness less than that of the one-molecular layer. The TiCl$_4$ molecules constituting the adsorption layer of TiCl$_4$ include those in which the bond between Ti and Cl is partially broken. That is, the adsorption layer of TiCl$_4$ may be a physical adsorption layer of TiCl$_4$, may be a chemisorption layer of TiCl$_4$, or may include both of the adsorption layers. However, under the processing conditions described above, chemical adsorption is dominant over physical adsorption of TiCl$_4$ onto the wafer 200.

Herein, a layer having a thickness of less than a one-atom layer denotes an atomic layer which is discontinuously formed, and a layer having a thickness of a one-atom layer is an atomic layer which is continuously formed. A layer having a thickness of less than a one-molecule layer denotes a molecular layer which is discontinuously formed, and a layer having a thickness of a one-molecule layer denotes a molecular layer which is continuously formed. The first Ti-containing layer may include a Ti single layer, a Ti layer containing Cl, or an adsorption layer of TiCl$_4$. However, as described above, the Ti-containing layer containing Cl is expressed by using expressions such as a "one-atom layer" or a "several-atom layer". This point is also the same in the examples to be described later.

(Residual Gas Removing Step)

After the first Ti-containing layer is formed, the valve 314 is closed to stop the supply of the TiCl$_4$gas. At this time, by evacuating the interior of the processing chamber 201 by the vacuum pump 246 in the state where the APC valve 243 of the exhaust pipe 231 is maintained open, the TiCl$_4$ gas unreacted or after contributing to formation of the first Ti-containing layer, which remains in the processing chamber 201, is removed from the interior of the processing chamber 201. That is, the TiCl$_4$ gas, unreacted or after contributing to the formation of the first Ti-containing layer, which remains in the space where the wafer 200 in which the first Ti-containing layer is formed exists, is removed. At this time, in the state where the valves 514, 524, and 534 are maintained open, the supply of the N$_2$ gas into the processing chamber 201 is maintained. The N$_2$ gas functions as a purge gas to enhance the effect of removing the TiCl$_4$ gas unreacted or after contributing to the formation of the first Ti-containing layer, which remains in the processing chamber 201, from the interior of the processing chamber 201.

At this time, it is unnecessary to completely remove the gas remaining in the processing chamber 201, and it is unnecessary to completely purge the interior of the processing chamber 201. If the amount of gas remaining in the processing chamber 201 is very small, no adverse effect occurs in subsequent steps. It is unnecessary to set the flow rate of the N$_2$ gas supplied into the processing chamber 201 to a large flow rate, and for example, by supplying an amount substantially equal to the volume of the reaction tube 203 (the processing chamber 201), it is possible to perform purge to a degree that adverse effects occurs in subsequent steps. As described above, by not purging the interior of the processing chamber 201 perfectly, the purge time can be shortened, and thus, it is possible to improve the throughput. In addition, consumption of the N$_2$ gas can be suppressed to the minimum necessary.

(N-Containing Gas Supplying Step)

After the residual gas in the processing chamber 201 is removed, the valve 334 is opened, and the NH$_3$ gas which is an N-containing gas is allowed to flow into the gas supply pipe 330. The flow rate of the NH$_3$ gas flowing through the gas supply pipe 330 is controlled by the MFC 332. The flow-rate-adjusted NH$_3$ gas is supplied into the processing chamber 201 from the gas supply hole 430a of the nozzle 430. The NH$_3$ gas supplied into the processing chamber 201 is exhausted from the exhaust pipe 231. At this time, the thermally activated NH$_3$ gas is supplied to the wafer 200. That is, the surface of the wafer 200 is exposed to the NH$_3$ gas. At the same time, the valve 534 is opened, and thus, the N$_2$ gas is allowed to flow into the gas supply pipe 530. The flow rate of the N$_2$ gas flowing through the gas supply pipe 530 is controlled by the MFC 532. The N$_2$ gas is supplied into the processing chamber 201 together with the NH$_3$ gas and is exhausted from the exhaust pipe 231. At this time, in order to prevent the NH$_3$ gas from entering the nozzles 410 and 420, the valves 514 and 524 are opened, and thus, the N$_2$ gas is allowed to flow into the gas supply pipes 510 and 520. The N$_2$ gas is supplied into the processing chamber 201 through the gas supply pipes 310 and 320, the nozzle 410, and the nozzle 420 and is exhausted from the exhaust pipe 231.

In the case of flowing the NH$_3$ gas, by appropriately controlling the APC valve 243, the internal pressure of the processing chamber 201 is set to, for example, a (predetermined) pressure within a range of 0.01 to 70,000 Pa, preferably a (predetermined) pressure within a range of 1 to 1330 Pa, more preferably a (predetermined) pressure within a range of 50 to 100 Pa. If the pressure is lower than 0.01 Pa, there is a possibility that the film formation rate becomes too low. If the pressure is higher than 70000 Pa, there is a possibility that the residual gas cannot be sufficiently removed by the residual gas removing step described later.

The supply flow rate of the NH$_3$ gas controlled by the MFC 332 is set to, for example, a (predetermined) flow rate within a range of 0.1 to 20 slm, preferably a (predetermined) flow rate within a range of 0.3 to 10 slm, preferably, a (predetermined) flow rate in the range of 1 to 8 slm. If the flow rate is less than 0.1 slm, there is a possibility that the gas cannot sufficiently react with the first Ti-containing layer formed on the wafer 200, and thus, Cl having an allowable amount or more remains in the TiN layer, so that the resistance of the TiCN film becomes high. If the flow rate is more than 20 slm, there is a possibility that residual gas cannot be sufficiently removed by the residual gas removing step to be described later.

The supply flow rate of the N$_2$ gas controlled by the MFCs 512, 522, and 532 is set to, for example, a (predetermined) flow rate within a range of 0.2 to 20 slm, preferably a (predetermined) flow rate within a range of 0.4 to 15 slm, more preferably a (predetermined) flow rate within a range of 0.4 to 7.5 slm. If the flow rate is less than 0.2 slm, there is a possibility that the NH$_3$ gas is not sufficiently supplied to the wafer 200. If the flow rate is more than 20 slm, there is a possibility that the film formation rate becomes too low.

The time to supply the NH$_3$ gas to the wafer 200, that is, the gas supply time (irradiation time) is set to, for example, a (predetermined) time within a range of 0.001 to 300 seconds, preferably a (predetermined) time within a range of 0.005 to 60 seconds, more preferably a (predetermined) time within a range of 10 to 25 seconds. If the supply time is shorter than 0.001 second, there is a possibility that the gas cannot sufficiently react with the first Ti-containing layer formed on the wafer 200, Cl having an allowable amount or more remains in the TiN layer, so that the resistance of the TiCN film becomes high. If the supply time is longer than 300 seconds, there is a possibility that the throughput is deteriorated.

The temperature of the heater 207 is set to the same temperature as the halogen-based source gas supplying step.

By supplying the NH$_3$ gas to the wafer 200 under the above-described conditions, at least a portion of the first Ti-containing layer formed on the wafer 200 in the halogen-based source gas supplying step is nitrified (reforming, substitution reaction). By nitriding the first Ti-containing layer, a TiN layer which is a first layer containing Ti and N is formed on the wafer 200.

(Residual Gas Removing Step)

After forming the TiN layer, the valve 334 is closed to stop the supply of the NH$_3$ gas. At this time, by evacuating the interior of the processing chamber 201 by the vacuum pump 246 in the state where the APC valve 243 of the exhaust pipe 231 is maintained open, the NH$_3$ gas unreacted or after contributing to the formation of the TiN layer and the reaction by-products, which remain in the processing chamber 201, are removed from the interior of the processing chamber 201. At this time, in the state where the valves 514, 524, and 534 are maintained open, the supply of the N$_2$ gas into the processing chamber 201 is maintained. The N$_2$ gas functions as a purge gas to enhance the effect of removing the NH$_3$ gas unreacted or after contributing to the formation of the TiN layer and reaction by-products, which remain in the processing chamber 201, from the interior of the processing chamber 201.

At this time, similarly to the residual gas removing step after the halogen-based source gas supplying step, it is unnecessary to completely remove the gas remaining in the processing chamber 201, and it is unnecessary to completely purge the interior of the processing chamber 201.

(Performing Predetermined Number of Times)

A TiN layer (first layer) having a predetermined thickness is formed on the wafer 200 by performing one or more times (predetermined number of times) a cycle of sequentially performing, in a time division manner, the halogen-based source gas supplying step, the residual gas removing step, the N-containing gas supplying step, and the residual gas supplying step, that is, by setting, as one cycle, the processes of the halogen-based source gas supplying step, the residual gas removing step, the N-containing gas supplying step, and the residual gas supplying step and by performing these processes for $n_1$ cycle ($n_1$ is an integer of 1 or more).

It is preferable that the cycle described above is repeated a plurality of times. In a case where the cycle is performed a plurality of times, in each of the steps at least in the second and subsequent cycles, the expression "to supply a gas to the wafer 200" denotes "to supply a predetermined gas to the layer formed on the wafer 200, that is, to the uppermost surface of the wafer 200 as a laminated body ", and the expression "to form a predetermined layer on the wafer 200" denotes "to form a predetermined layer on the layer formed on the wafer 200, that is, on the uppermost surface of the wafer 200 as a laminated body ". This point is also the same in the examples to be described later.

(TiCN Layer Forming Step)

Subsequently, the step of forming the TiCN layer as the second layer is executed. The TiCN layer forming step includes an organic-based source gas supplying step, a residual gas removing step, an N-containing gas supplying step, and a residual gas removing step described below.

(Organic-Based Source Gas Supplying Step)

The valve 324 is opened, and thus, the TDMAT gas which is an organic-based source gas is allowed to flow into the gas supply pipe 320. The flow rate of the TDMAT gas flowing through the gas supply pipe 320 is controlled by the NFC 322. The flow-rate-adjusted TDMAT gas is supplied into the processing chamber 201 from the gas supply hole 420a of the nozzle 420 and is exhausted from the exhaust pipe 231. At this time, the TDMAT gas is supplied to the wafer 200. That is, the surface of the wafer 200 is exposed to the TDMAT gas. At the same time, the valve 524 is opened, and thus, the $N_2$ gas is allowed to flow into the gas supply pipe 520. The flow rate of the $N_2$ gas flowing through the gas supply pipe 520 is controlled by the MFC 522. The flow-rate-adjusted $N_2$ gas is supplied into the processing chamber 201 together with the TDMAT gas and is exhausted from the exhaust pipe 231. In addition, at this time, in order to prevent the TDMAT gas from entering the nozzle 410 and the nozzle 430, the valves 514 and 534 are opened, and thus, the $N_2$ gas is allowed to flow into the gas supply pipe 510 and the gas supply pipe 530. The $N_2$ gas is supplied into the processing chamber 201 through the gas supply pipe 310, the gas supply pipe 330, the nozzle 410, and the nozzle 430 and is exhausted from the exhaust pipe 231.

At this time, by appropriately controlling the APC valve 243, similarly to the step 11, the internal pressure of the processing chamber 201 is set to, for example, a (predetermined) pressure within a range of 1 to 10000 Pa, preferably a (predetermined) pressure within a range of 1 to 500 Pa, more preferably a (predetermined) pressure within a range of 40 to 60 Pa. If the pressure is lower than 1 Pa, there is a possibility that the film formation rate becomes too low. If the pressure is higher than 1000 Pa, there is a possibility that the residual gas cannot be sufficiently removed by the residual gas removing step described later, and reaction by-products having an allowable amount or more are taken into the second layer.

The supply flow rate of the TDMAT gas controlled by the MFC 322 is set to, for example, a (predetermined) flow rate within a range of 0.001 to 3 slm, preferably a (predetermined) flow rate within a range of 0.001 to 1 slm, more preferably, a (predetermined) flow rate within a range of 0.001 to 0.002 slm. If the flow rate is less than 0.001 slm, there is a possibility that the film formation rate becomes too low. If the flow rate is more than 3 slm, there is a possibility that reaction by-products having an allowable amount or more are taken into the second layer. Within the above range, the higher the flow rate is, the higher the concentration of C taken into the TiCN layer is, so that the dry etching resistance is improved. It is advisable to change the supply flow rate of the TDMAT gas according to a degree of the desired dry etching resistance.

The supply flow rate of the $N_2$ gas controlled by the MFCs 512, 522, and 532 is set to, for example, a (predetermined) flow rate in the range of 0.2 to 20 slm, preferably a (predetermined) flow rate within a range of 0.4 to 15 slm, more preferably a (predetermined) flow rate within a range of 0.3 to 0.6 slm. If the flow rate is less than 0.2 slm, there is a possibility that reaction by-products having an allowable amount or more are taken into the second layer. If the flow rate is more than 20 slm, there is a possibility that the film formation rate becomes too low.

The time for supplying the TDMAT gas to the wafer 200, that is, the gas supply time (irradiation time) is set to, for example, a (predetermined) time within a range of 0.1 to 120 seconds, preferably a (predetermined) time within a range of 0.5 to 30 seconds, more preferably a (predetermined) time within a range of 8 to 12 seconds. If the supply time is shorter than 0.1 second, there is a possibility that the film formation rate becomes too low. If the supply time is longer than 120 seconds, there is a possibility that reaction by-products having an allowable amount or more are taken into the second layer.

The temperature of the heater 207 at this time is set to the same temperature as the halogen-based source gas supplying step. By supplying the TDMAT gas to the wafer 200 under the above-described conditions, the second Ti-containing layer is formed on the wafer 200 (the underlying film on the surface, in this case, the TiN layer).

In some cases, the second Ti-containing layer maybe a Ti layer containing single Ti atoms. However, in many cases, the second Ti-containing layer may contain other atoms derived from respective source materials, and thus, in the organic-based source gas supplying step using the TDEAT gas, the second Ti-containing layer often includes C, N, and H. Therefore, the second Ti-containing layer includes a TDEAT layer which is a deposition layer of TDEAT. The TDEAT layer includes a deposition layer configured with TDEAT molecules. The TDEAT molecules constituting the TDEAT layer include those in which the bonds among C, N and H are partially broken.

With respect to the internal pressure of the processing chamber 201 and the temperature of the heater 207, since the TDEAT molecules are not saturated adsorbed on the wafer 200 in many cases, even in a case where the internal pressure of the processing chamber and the temperature of the heater at the time of supplying the TDEAT gas are made equalized, the film thickness of the second Ti-containing layer deposited on the wafer 200 can be controlled (adjusted, modulated, tuned, controlled) by changing (adjusting, controlling) the supply flow rate and the supply time of the TDEAT gas. That is, by changing (adjusting, controlling) the supply flow rate and the supply time of the TDEAT gas, the atomic concentrations of C, N, and H contained in the second Ti-containing layer deposited on the wafer 200 can be controlled (adjusted, modulated, tuned, controlled), and thus, it becomes possible to control (adjust, modulate, tune, and control) the film formation rate of the TiCN layer.

In a case where the supply flow rate of the TDEAT gas is reduced or the supply time of the TDEAT gas is shortened, the second Ti-containing layer having a thickness of less than a one-molecule layer is formed on the wafer 200. In a case where the main constituent component of the second Ti-containing layer is Ti single atom, it can be said that the second Ti-containing layer has a thickness of less than a one-atom layer. As the supply flow rate of the TDEAT gas is increased or the supply time of the TDEAT gas is lengthened, the thickness of the second Ti-containing layer formed on the wafer 200 becomes a thickness of from a one-molecule layer to a several-molecule layer. In a case where the main constituent component constituting the second Ti-containing layer is Ti single atom, it can be said that the second Ti-containing layer has a thickness of a one-atom layer to a several-atom layer.

(Residual Gas Removing Step)

After that, the valve 324 is closed to stop the supply of the TDMAT gas. By the same processing procedure as that of the residual gas removing step after the halogen-based source gas supplying step, the TDMAT gas unreacted or after contributing to the formation of the Ti-containing layer 2, which remains in the processing chamber 201, that is, in the space where the wafer 200 on which the second Ti-containing layer is formed exists, is removed from the interior of the processing chamber 201. At this time, the point that it is unnecessary to completely remove the gas remaining in the processing chamber 201 is the same as that of the residual gas removing step after the halogen-based source gas supplying step.

(N-Containing Gas Supplying Step)

Next, the $NH_3$ gas as an N-containing gas is supplied into the processing chamber 201 under the processing procedure and processing conditions similar to those of the above-described N-containing gas supplying step. By supplying the $NH_3$ gas to the wafer 200 under the above-described conditions, at least a portion of the Ti-containing layer formed on the wafer 200 and the $NH_3$ gas are subjected to a substitution reaction. During the substitution reaction, Ti contained in the Ti-containing layer and N contained in the $NH_3$ gas are bonded to each other to form the TiCN layer containing Ti, C, and N on the wafer 200. The TiCN layer is also called a Ti (C)N layer or a TiN layer.

(Residual Gas Removing Step)

Subsequently, by the same process as that of the residual gas supplying step after the above-described halogen-based source gas supplying step, the $NH_3$ gas unreacted or after contributing to the formation of the above-described TiCN layer and the by-products, which remain in the processing chamber 201, are removed from the interior of the processing chamber 201.

A TiCN layer (second layer) having a predetermined thickness (for example, 0.1 to 10 nm) is formed on the wafer 200 by performing one or more times (predetermined number of times) a cycle of sequentially performing, in a time division manner, the organic-based source gas supplying step, the residual gas removing step, the N-containing gas supplying step, and the residual gas removing step, that is, by setting, as one cycle, the processes of the organic-based source gas supplying step, the residual gas removing step, the N-containing gas supplying step, and the residual gas removing step and by performing these processes for $n_2$ cycles ($n_2$ is an integer of 1 or more). It is preferable that the cycle described above is repeated a plurality of times.

(Performing Predetermined Number of Times)

By performing the step of forming the TiN layer (first layer) and the step of forming the TiCN layer (second layer) $n_3$ times ($n_3$ is an integer of 1 or more) in a time division manner, a TiCN film having a predetermined thickness and configured as a laminated film in which a TiN layer and a TiCN layer are alternately laminated on the wafer 200 is formed. The thickness of the TiCN film is a (predetermined) thickness within a range of 5 to 30 nm, preferably a (predetermined) thickness within a range of 5 to 20 nm, more preferably a (predetermined) thickness within a range of 5 to 10 nm. If the thickness of the TiCN film is less than 5 nm, there is a possibility that the etching resistance becomes too low and the TiCN film disappears during etching, so that the function as a hard mask may not be fulfilled. If the thickness of the TiCN film exceeds 30 nm, there is a possibility that it is difficult to process the pattern perpendicularly to the substrate due to the problem of processability. The thickness of the TiCN film includes an error of the range in which the required properties of the TiCN film are not affected. It is preferable that the above steps are repeated a plurality of times.

Herein, according to the number of times ($n_1$ times described above) of performing the step of forming the TiN layer and the number of times ($n_2$ times described above) of performing the step of forming the TiCN layer, it is possible to adjust the ratio of the element C contained in the finally formed TiN film. That is, by adjusting the number of times ($n_1$ times mentioned above) of using the $TiCl_4$ gas which is a halogen-based source gas as the metal-containing gas containing titanium as the metal element and the number of times ($n_2$ times as described above) of using the TDMAT gas as the organic-based source gas, it is possible to adjust the ratio of C, which is an element derived from each source material contained in the finally formed TiN film. That is, by adjusting the number of times of each process, it is possible to tune (adjust, modulate) the work function of the gate electrode configured with the first and second TiN films. In other words, each value of $n_1$ and $n_2$ is determined according to the ratio of C to be contained in the TiN film.

Therefore, it is possible to form a metal film having a desired C concentration by determining the values of $n_1$ and $n_2$ according to the ratio of C to be contained in the TiCN film. In addition, the C concentration contained in the TiCN film is set to, for example, a (predetermined) concentration within a range of 5 to 50%, a (predetermined) concentration within a range of 5 to 40%, or a (predetermined) concentration within a range of 5 to 30%. In a case where the C concentration is less than 5%, there is a possibility that the etching resistance may be lowered. In a case where the concentration exceeds 50%, there is a possibility that it may be difficult to remove the TiCN film as a hard mask.

(Purge and Return to Atmospheric Pressure)

The valves 514, 524, and 534 are opened, $N_2$ gas is supplied into the processing chamber 201 from each of the gas supply pipes 510, 520, and 530 and exhausted from the exhaust pipe 231. The $N_2$ gas functions as a purge gas. Therefore, the interior of the processing chamber 201 is purged with an inert gas, and the gases and byproducts remaining in the processing chamber 201 are removed (purged) from the processing chamber 201. After that, the atmosphere in the processing chamber 201 is replaced with an inert gas (inert gas replacement), and the pressure in the processing chamber 201 is restored to the atmospheric pressure (atmospheric pressure restoration).

(Boat Unloading and Wafer Discharging)

After that, the seal cap 219 is lowered by the boat elevator 115, and the lower end of the reaction tube 203 is opened. Then, in the state where the processed wafer 200 is supported by the boat 217, the boat is carried out (boat unloading) from the lower end of the reaction tube 203 to the outside of the reaction tube 203. After that, the processed wafer 200 is taken out from the boat 217 (wafer discharging).

FIG. 5 is a view illustrating a technique of forming a pattern on a substrate by a double patterning method. First, a hard mask 601 is formed on a wafer 200, a first resist solution 602a is applied onto the hard mask 601 (FIG. 5A), and a first resist pattern 603a is formed by selective exposure, development, and the like (FIG. 5B). Next, a barrier film (protective film) 604 is formed on the first resist pattern 603a and on the hard mask 601 on which the first resist pattern is not formed (FIG. 5C). In addition, a second resist solution 602b is applied onto the barrier film 604 (FIG. 5D), and a second resist pattern 603b is formed by selective exposure, development, and the like at a position different from the position where the first resist pattern 603a is formed (FIG. 5E). Finally, the barrier film 604 is removed by a wet etching method or a dry etching method (FIG. 5F). By performing these series of processes, it becomes possible to form a pattern on the wafer 200 that exceeds the resolution limit of lithography. The TiCN film formed in the present embodiment can be used as the hard mask 601. In addition, the TiCN film formed in the present embodiment can also be used as the barrier film 604.

(3) Effects of the Present Embodiment

According to the present embodiment, one or more of the following effects are obtained.

(A) By forming a TiCN film (laminated film) by using a halogen-based source gas and an organic-based source gas as a Ti-containing gas, C, N, and H which are constituent components derived from the organic-based source gas are taken into the TiCN film. Since C and the like have a property of being hard to be bonded to a halide contained in an etching gas used at the time of dry etching, it is possible to lower the dry etching rate of the TiCN film. That is, it is possible to improve the dry etching resistance.

(B) By adjusting the number of times ($n_1$ times) of forming the TiN layer by using the halogen-based source gas and the number of times ($n_2$ times) of forming the TiCN layer by using the organic-based source gas, the C concentration contained in the TiCN film is set to, for example, a (predetermined) concentration within a range of 5 to 50%, a (predetermined) concentration within a range of 5 to 40%, or a (predetermined) concentration within a range of 5 to 30%, so that it is possible to obtain high dry etching resistance required for a hard mask.

(C) By adjusting the supply flow rate and/or the supply time of the TDMAS gas in the TiCN layer forming step, the C concentration contained in the TiCN film is set to, for example, a (predetermined) concentration within a range of, for example, 5 to 50%, a (predetermined) concentration within a range of 5% to 40%, or a (predetermined) concentration within a range of 5 to 30%, so that it is possible to obtain high dry etching resistance required for a hard mask.

(D) By using a film containing C such as a TiCN film as a hard mask, even in a case where a halide contained in the etching gas used for dry etching is bonded to the TiCN film, since the vapor pressure of the substance generated by the bonding is lowered, the substance is not separated (not removed) from the hard mask, and thus, it is Possible to obtain a hard mask having high dry etching resistance which is not removed by dry etching.

(E) By adjusting the number of times ($n_1$ times) for forming the TiN layer by using the halogen-based source gas and the number of times for forming the TiCN layer ($n_2$ times) by using the organic-based source gas, it is possible to adjust the composition ratio of the C element by the film thickness ratio of the films of the TiCN film (laminated film) configured with the TiN layer and the TiCN layer, and thus, it is possible to control the work function. That is, according to the present embodiment, it is possible to improve the controllability of the atomic concentration of the element C contained in the finally obtained TiN film, and thus, it is possible to improve the controllability of the work function of the TiCN film.

(F) At the time of forming the TiCN film, by selecting, as the Ti-containing gas, a gas having a different molecular structure (chemical structure) such as a halogen-based source gas and an organic-based source gas, it is possible to adjust the composition ratio of the elements derived from the respective Ti-containing gases contained in the film formed on the substrate.

Hereinafter, with respect to the other embodiments, the same components as those of the first embodiment will be omitted in detailed description, and components different from those of the first embodiment will be described.

Second Embodiment of the Present Disclosure

Figure 6:
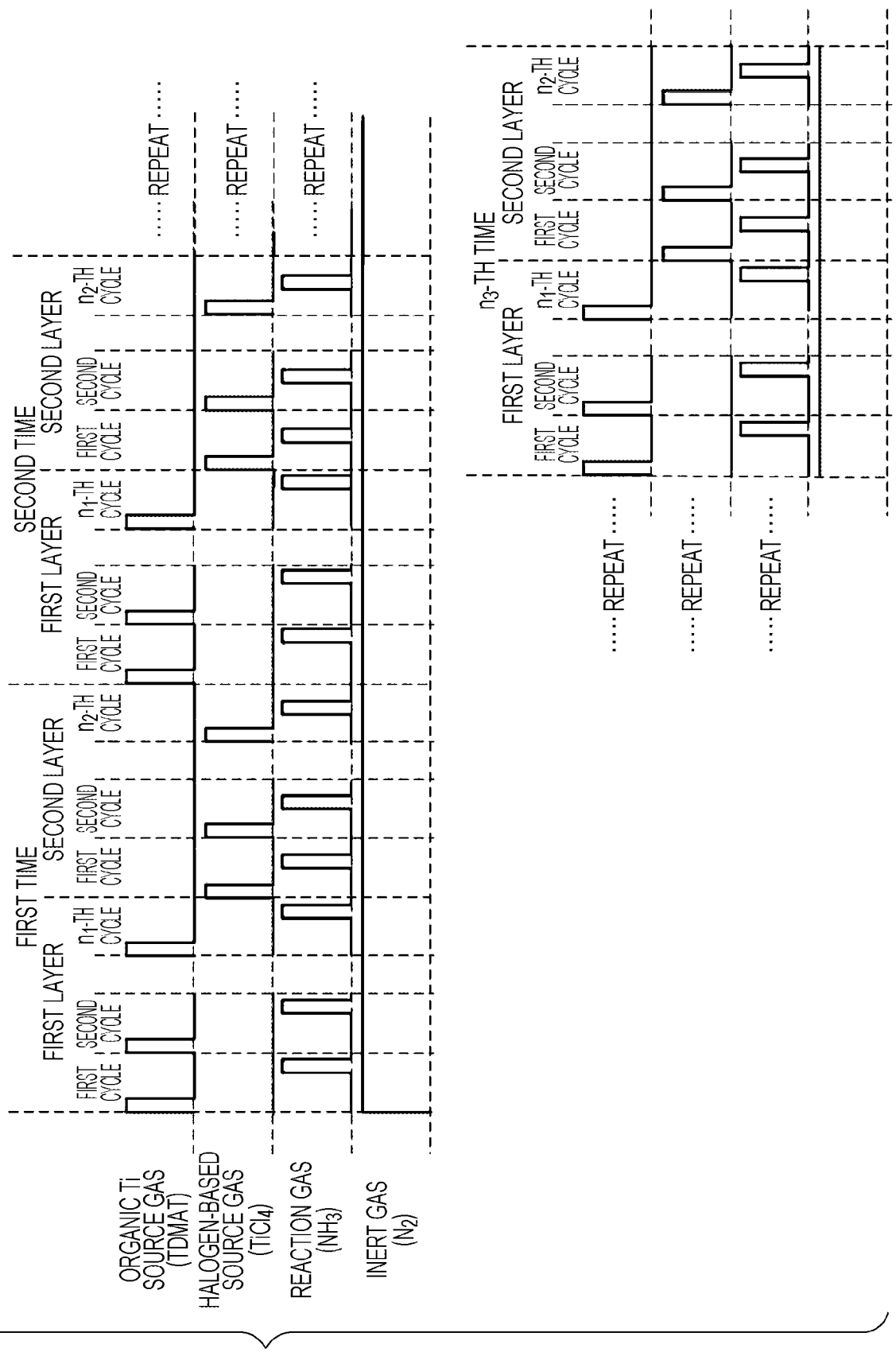
FIG. 6 is a diagram illustrating a sequence according to a second embodiment of the present disclosure.

In the present embodiment, as illustrated in FIG. 6, the TiCN film is formed on the wafer 200 by setting, as one cycle, a cycle of the of the organic-based source gas supplying step, the residual gas removing step, the N-containing gas supplying step, and the residual gas removing step and sequentially performing, in a time division manner, these steps for $n_1$ cycles ($n_1$ is an integer of 1 or more) and, after that, by setting, as one cycle, a cycle of the halogen-based source gas supplying step, the residual gas removing step, the N-containing gas supplying step, and the residual gas removing step and by sequentially performing, in a time division manner, these steps for $n_2$ cycles ($n_2$ is an integer of 1 or more), and by performing these cycles $n_3$ times ($n_3$ is an integer of 1 or more).

As in the present embodiment, by flowing, first, the organic-based source gas instead of the halogen-based source gas, it is possible to improve the wettability of the substrate or to reduce the surface energy of the crystal nucleus, and thus, it is possible to expect that the nuclear density becomes high. Therefore, it is also possible to obtain the effect of improving the surface roughness of the film.

Third Embodiment of the Present Disclosure

Figure 7:
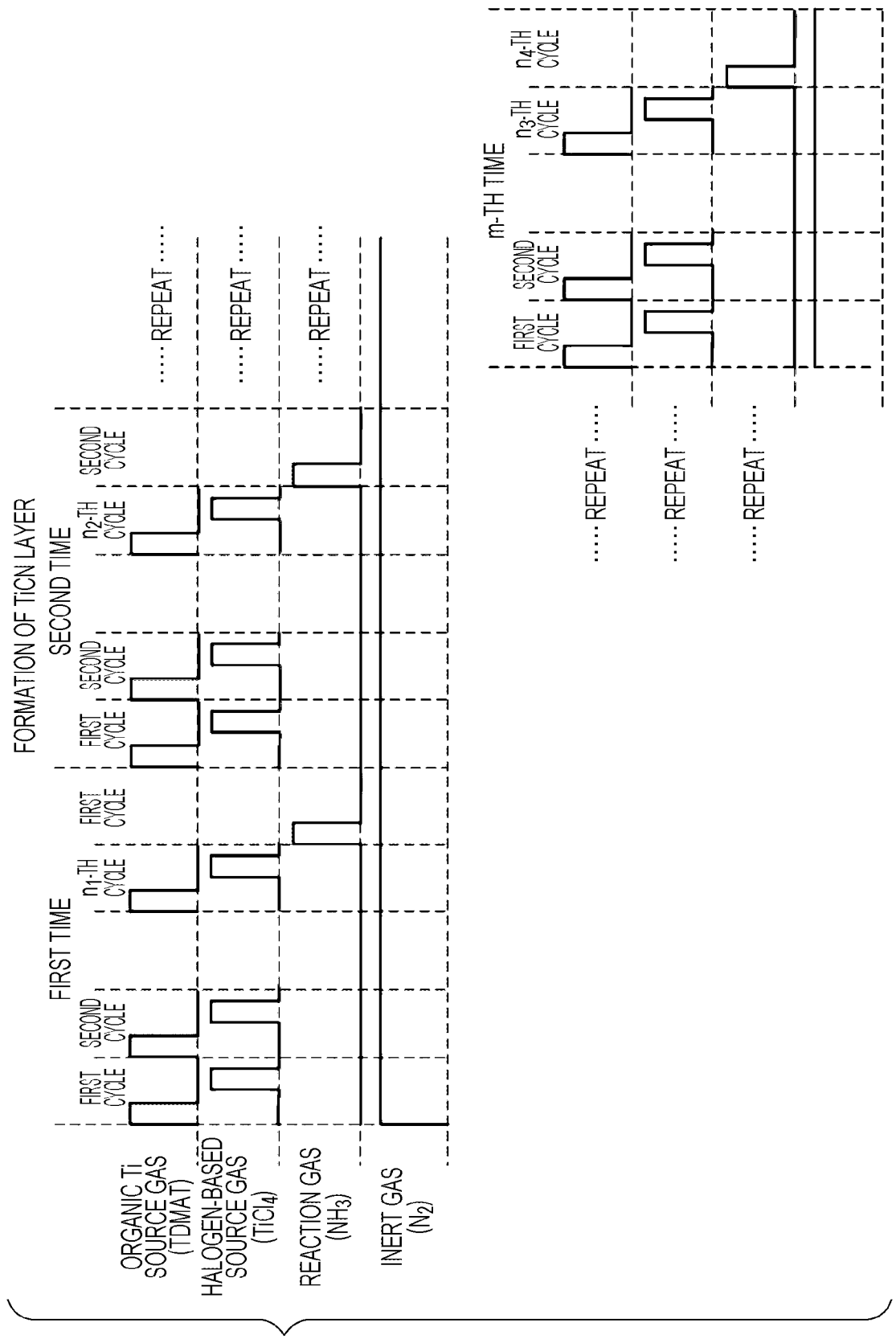
FIG. 7 is a diagram illustrating a sequence according to a third embodiment of the present disclosure.

In the present embodiment, as illustrated in FIG. 7, the TiCN film is formed on the wafer 200 by setting, as one cycle, a cycle of the organic-based source gas supplying step, the residual gas removing step, the halogen-based source gas supplying step, and the residual gas removing step and sequentially performing, in a time division manner, these steps for $n_1$ cycles ($n_1$ is an integer of 1 or more) and, after that, performing the N-containing gas supplying step for one cycle, and by performing these cycles m times (m is an integer of 1 or more).

By performing the N-containing gas supplying step independently as in the present embodiment, the N concentration contained in the TiCN film can be adjusted independently, and thus, it is possible to increase the controllability of the N concentration.

Fourth Embodiment of the Present Disclosure

Figure 8:
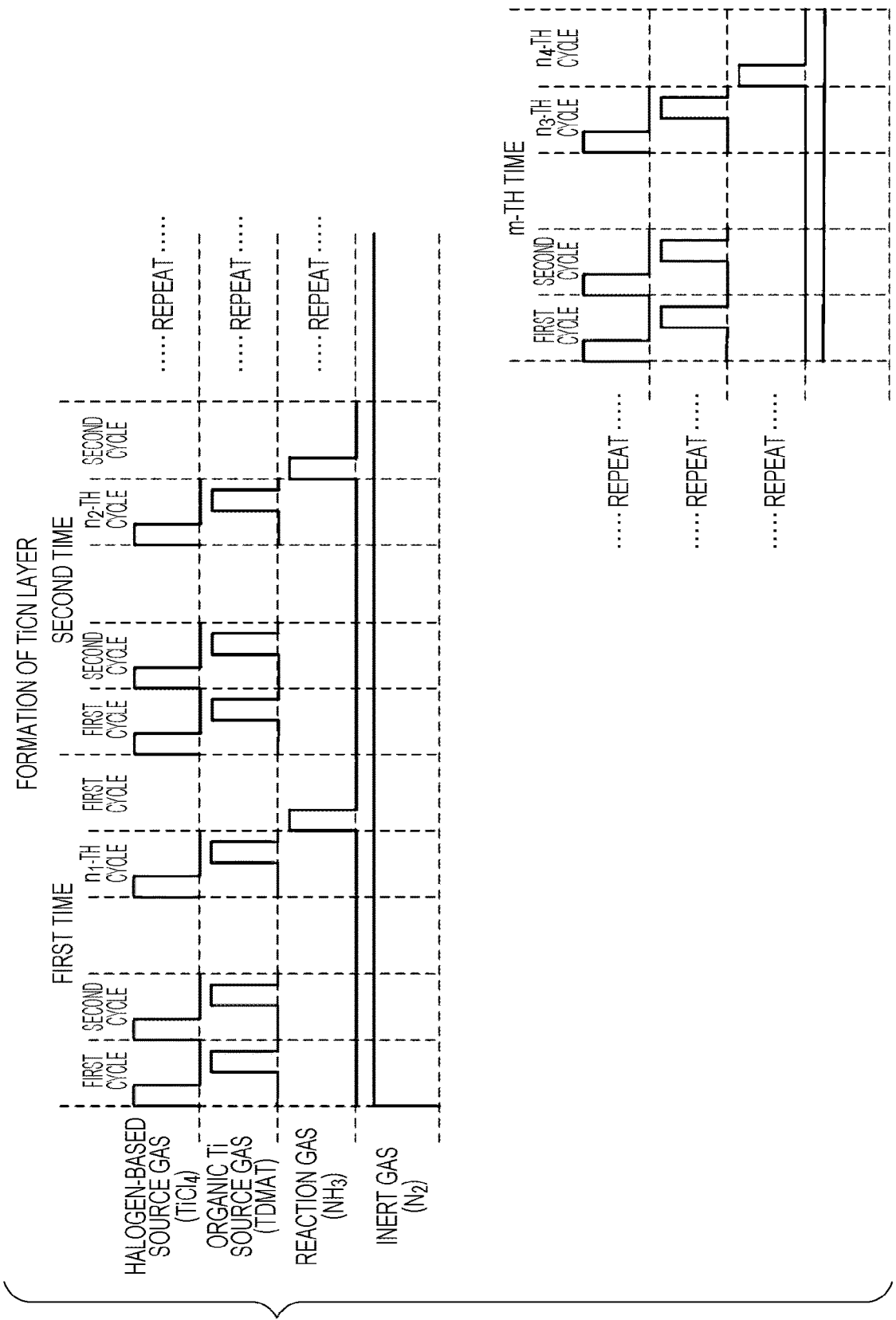
FIG. 8 is a diagram illustrating a sequence in a fourth embodiment of the present disclosure.

In the present embodiment, as illustrated in FIG. 8, the TiCN film is formed on the wafer 200 by setting, as one cycle, a cycle of the halogen-based source gas supplying step, the residual gas removing step, the organic-based source gas supplying step, and the residual gas removing step and sequentially performing, in a time division manner, these steps for $n_1$ cycles ($n_1$ is an integer of 1 or more) and, after that, performing the N-containing gas supplying step for one cycle, and by performing these cycles m times (m is an integer of 1 or more).

By performing the N-containing gas supplying step independently as in the present embodiment, the N concentration contained in the TiCN film can be adjusted independently, and thus, it is possible to increase the controllability of the N concentration.

Fifth Embodiment of the Present Disclosure

Figure 9:
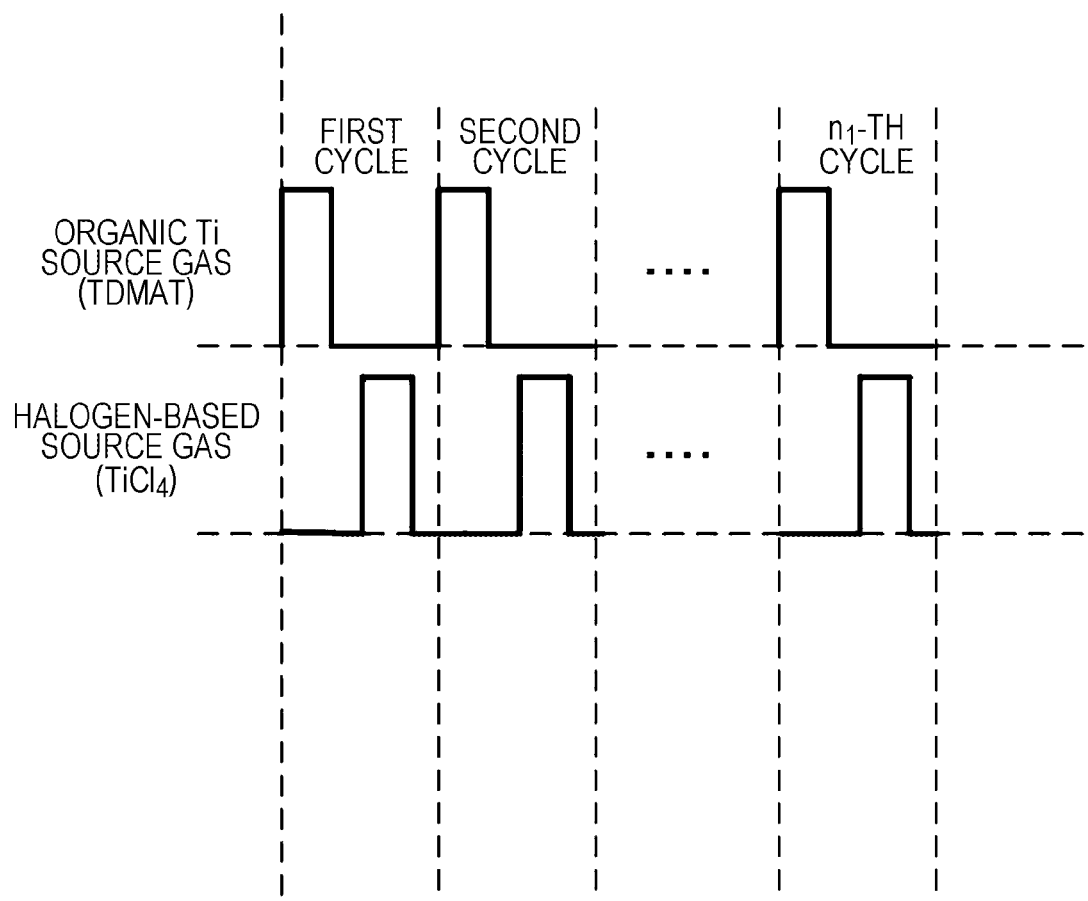
FIG. 9 is a diagram illustrating a sequence according to a fifth embodiment of the present disclosure.

In the present embodiment, as illustrated in FIG. 9, the TiCN film is formed on the wafer 200 by setting, as one cycle, a cycle of the organic-based source gas supplying step, the residual gas removing step, the halogen-based source gas supplying step, and the residual gas removing step and sequentially performing, in a time division manner, these steps for $n_1$ cycles ($n_1$ is an integer of 1 or more).

As in the present embodiment, by forming the TiCN film with the organic-based source gas and the halogen-based source gas without using the N-containing gas, it is possible to obtain a higher C concentration.

Other Embodiments of the Present Disclosure

The above-described embodiments may be used in an appropriate combination. Furthermore, the present disclosure is not limited to the above-described embodiments, and various modifications can be made without departing from the spirit of the present disclosure.

In the above-described embodiments, the example where Ti is used as a metal element has been described. The present disclosure is not limited to the above-described embodiment, and even in the case of forming any one of a nitride film, an oxide film, a carbide film, a boride film, or a composite film thereof, containing an element such as tantalum (Ta), tungsten (W), cobalt (Co), yttrium (Y), ruthenium (Ru), aluminum (Al), hafnium (Hf), zirconium (Zr), molybdenum (Mo), or silicon (Si) as an element other than Ti, the present disclosure may be appropriately applied.

In the case of forming a film containing the above elements, in addition to the titanium (Ti)-containing gas, a tantalum (Ta)-containing gas, a tungsten (W)-containing gas, a cobalt (Co)-containing gas, an yttrium (Y)-containing gas, a ruthenium (Ru)-containing gas, an aluminum (Al)-containing gas, a hafnium (Hf)-containing gas, a zirconium (Zr)-containing gas, a molybdenum (Mo)-containing gas, a silicon (Si)-containing gas, or the like may be used as a source gas.

In the case of forming a film containing the above elements, as the halogen-based source gas as the inorganic-based source gas, there may be used, for example, besides $TiCl_4$, titanium tetrafluoride ($TiF_4$), tantalumpentachloride ($TaCl_5$), tantalumpentafluoride ($TaF_5$), tungsten hexachloride ($WCl_6$), tungsten hexafluoride ($WF_6$), cobalt dichloride ($CoCl_2$), cobalt dichloride ($CoF_2$), yttrium trichloride ($YCl_3$), yttrium trifluoride ($YF_3$), ruthenium trichloride ($RuCl_3$), ruthenium trifluoride ($RuF_3$), aluminum trichloride ($AlCl_3$), aluminum trifluoride ($AlF_3$), hafnium tetrachloride ($HfCl_4$), hafnium tetrafluoride ($HfF_4$), zirconium tetrachloride ($ZrCl_4$), zirconium tetrafluoride ($ZrF_4$), tetrachlorosilane, that is, silicon tetrachloride or silicon tetrachloride ($SiCl_4$, abbreviation: STC), dichlorosilane ($SiH_2Cl_2$, abbreviation: DCS), monochlorosilane ($SiH_3Cl$, abbreviation: MCS), hexachlorodisilane, that is, silicon dioxide hexachloride ($Si_2Cl_6$, abbreviation: HCDS), and the like.

In the case of forming a film containing the above elements, as the organic-based source gas, there may be used, for example, besides the TDEAT, tetrakis dimethylamino titanium ($Ti[N(CH_3)_2]_4$, abbreviation: TDMAT), pentaethoxy tantalum ($Ta(OC_2H_5)_5$, abbreviation: PET), trimethyl aluminum (($CH_3)_3Al$, abbreviation: TMA), Tetrakis ethylmethylamino hafnium ($Hf[N(CH_3)CH_2CH_3]_4$, abbreviation: TEMAH), Tetrakis dimethylamino hafnium ($Hf[N(CH_3)_2]_4$, TDMAH), Tetrakis diethylamino hafnium ($Hf[N(C_2H_5)_2]_4$, abbreviation: TDEAH), Tetrakis ethylmethylamino zirconium ($Zr[N(CH_3)CH_2CH_3]_4$, abbreviation: TEMAZ), Tetrakis dimethylamino zirconium($Zr[N(CH_3)_2]_4$, abbreviation:TDMAZ), Tetrakis diethylamino zirconium ($Zr[N(C_2H_5)_2]_4$, abbreviation:TDEAZ), tris dimethylamino cyclopentadienyl zirconium (($C_5H_5)Zr[N(CH_3)_2]_3$), Tetrakis (dimethylamino) silane ($Si[N(CH_3)_2]_4$, abbreviation: 4DMAS), tris(dimethylamino) silane ($Si[N(CH_3)_2]_3H$, abbreviation: 3DMAS), bis(diethylamino) silane ($Si[N(C_2H_5)_2]_2H_2$, abbreviation: BDEAS), bis(tert-butylamino) silane ($SiH_2[NH(C_4H_9)]_2$, abbreviation: BTBAS), bis(tert-butylimino)bis (tert-butylamino)tungsten (($C_4H_9NH)_2W(C_4H_9N)_2$), tungsten hexacarbonyl ($W(CO)_6$), bis(ethyl cyclopentadienyl)cobalt ($C_{14}H_{18}Co$), cobalt hexacarbonyl ($CoCO)_6$), tris(butyl cyclopentadienyl)yttrium ($Y(C_5H_4CH_2(CH_2)_2CH_3)_3$), bis(ethyl cyclopentadienyl)ruthenium ($C_{14}H_{18}Ru$), and the like.

In the case of forming a film containing the above elements, as the gas containing N—H bonds, for example, besides $NH_3$, there may be used nitrogen ($N_2$), nitrous oxide ($N_2O$), diazene ($N_2H_2$) gas, hydrazine ($N_2H_4$) gas, $N_3H_8$ gas, or the like. In addition, as the gas containing N—H bonds, besides the aforementioned gases, there may be used organic hydrazine-based gases, for example, a methyl hydrazine-based gas such as monomethyl hydrazine (($CH_3$)$HN_2H_2$, abbreviation: MMH) gas, dimethyl hydrazine (($CH_3)_2N_2H_2$, abbreviation: DMH) gas, or trimethyl hydrazine (($CH_3)_2N_2 (CH_3)H$, abbreviation: TMH) gas and an ethyl hydrazine-based gas such as ethyl hydrazine (($C_2H_5$)$HN_2H_2$, abbreviation: EH) gas. In addition, there may be used an ethylamine-based gas such as triethylamine (($C_2H_5)_3N$, abbreviation: TEA) gas, diethylamine (($C_2H_5)_2NH$, abbreviation: DEA) gas, or monoethylamine ($C_2H_5NH_2$, abbreviation: MEA) gas, a methylamine-based gas such as trimethylamine (($CH_3)_3N$, abbreviation: TMA) gas, dimethylamine (($CH_3)_2NH$, abbreviation: DMA) gas, or monomethylamine ($CH_3NH_2$, abbreviation: MMA), a propylamine-based gas such as tripropylamine (($C_3H_7)_3N$, abbreviation: TPA) gas, dipropylamine (($C_3H_7)_2NH$, abbreviation: DPA) gas, or monopropylamine ($C_3H_7NH_2$, abbreviation: MPA) gas, an isopropylamine-based gas such as triisopropylamine ($[(CH_3)_2CH]_3N$, abbreviation: TIPA) gas, diisopropylamine (($CH_3)_2CH]_2NH$, abbreviation: DIPA) gas, or monoisopropylamine (($CH_3)_2CHNH_2$, abbreviation: MIPA) gas, a butylamine-based gas such as tributylamine (($C_4H_9)_3N$, abbreviation: TBA) gas, dibutylamine (($C_4H_9)_2NH$, abbreviation: DBA) gas, or monobutylamine (($C_4H_9NH_2$, abbreviation: MBA) gas, and an isobutylamine-based gas such as triisobutylamine ($[(CH_3)_2CHCH_2]_3N$, abbreviation: TIBA) gas, diisobutylamine ($[(CH_3)_2CHCH_2]_2NH$, abbreviation: DIBA) gas, or monoisobutylamine (($CH_3)_2CHCH_2NH_2$, abbreviation: MIBA) gas. That is, as the amine-based gas, there may be used, for example, ($C_2H_5)_xNH_{3-x}$, ($C_3)_xNH_{3-x}$, ($C_3H_7)_xNH_{3-x}$, $[(CH_3)_2CH]_xNH_{3-x}$, ($C_4H_9)_xNH_{3-x}$, $[(CH_3)$ $_2CHCH_2]_xNH_{3-x}$ (where x is an integer of 1 to 3). When an organic hydrazine-based gas or amine-based gas is used, the reactivity can be enhanced, and C can be incorporated into the film, so that it is possible to adjust the work function of the film by controlling the C concentration.

As the film containing the above elements, in addition to a TiN film, a TiC film, and a TiCN film, there may be used, for example, a tantalum nitride film (TaN film), a tantalum carbide film (TaC film), a tantalum carbonitride film (TaCN film), a tungsten nitride film (WN film), a tungsten carbide film (WC film), a tungsten carbonitride film (WCN film), a cobalt nitride film (CoN film), a cobalt carbide film (CoC film), cobalt carbonitride film (CoCN film), an yttrium nitride film (YN film), a yttrium carbide film (YC film), a yttrium carbonitride film (YCN film), a ruthenium nitride film (RuN film), a ruthenium carbide film (RuC film), a ruthenium carbonitride film (RuCN film), an aluminum nitride film (AlN film), an aluminum carbide film (AlC film), an aluminum carbonitride film (AlCN film), a hafnium nitride film (HfN film), a hafnium carbide film (HfC film), a hafnium carbonitride film (HfCN film), a zirconium nitride film (ZrN film), a zirconium carbide film (ZrC film), a zirconium carbonitride film (ZrCN film), a molybdenum nitride film (MoN film), a molybdenum carbide film (MoC film), a molybdenum carbonitride film (MoCN film), a silicon nitride film (SiN film), a silicon carbide film (SiC film), a silicon carbonitride film (SiCN film), and the like.

In addition, in the above-described embodiments, the example using the $N_2$ gas as the inert gas is described. However, the present disclosure is not limited thereto, and a rare gas such as Ar gas, He gas, Ne gas, or Xe gas may be used.

In the above-described embodiments, in the substrate processing apparatus which is a batch-type vertical apparatus for processing a plurality of substrates at a time, the example of forming a film by using the processing furnace having a structure where the nozzle for supplying the processing gas into one reaction tube is provided and the exhaust outlet is provided in the lower portion of the reaction tube is described. However, the present disclosure may also be applied to an example of forming a film by using a processing furnace having another structure. For example, the present disclosure may also be applied to an example of forming a film by using a processing furnace having a structure in which two reaction tubes having concentric circular cross sections (the outer reaction tube is referred to as an outer tube and the inner reaction tube is referred to as an inner tube) are provided and the processing gas flows from a nozzle erected in the inner tube toward an exhaust outlet being opened to a position (line-symmetric position) on a sidewall of the outer tube facing the nozzle with a substrate interposed therebetween. In addition, the processing gas may be supplied from a gas supply port being opened to a sidewall of the inner tube, instead of being supplied from a nozzle erected in the inner tube. At this time, the exhaust outlet being opened to the outer tube may be opened according to the height at which a plurality of substrates stacked and accommodated in the processing chamber exist. In addition, the shape of the exhaust outlet may be a hole shape or a slit shape.

In addition, in the above-described embodiments, the example of forming a film by using the substrate processing apparatus which is a batch-type vertical apparatus for processing a plurality of substrates at one time is described. However, the present disclosure is not limited thereto, and the present disclosure may be appropriately applied to a case of forming a film by using a single wafer processing type substrate processing apparatus for processing one or several substrates at a time. In addition, in the above-described embodiments, the example of forming a thin film by using the substrate processing apparatus having a hot wall type processing furnace is described. However, the present disclosure is not limited thereto, and the present disclosure may also be appropriately applied to a case of forming a thin film by using a substrate processing apparatus having a cold wall type processing furnace. Even in these cases, the processing conditions may be set to, for example, processing conditions similar to those in the above-described embodiments.

For example, the present disclosure may also be appropriately applied to a case of forming a film by using a substrate processing apparatus provided with the processing furnace 302 illustrated in FIG. 9. The processing furnace 302 includes a processing vessel 303 constituting a processing chamber 301, a shower head 303s for supplying gases in a shower form into the processing chamber 301, a support base 317 for supporting one or several wafers 200 in a horizontal posture, a rotation shaft 355 for supporting the support base 317 from the lower portion, and a heater 307 provided on the support base 317. A gas supply port 332a for supplying the above-described source gas and a gas supply port 332b for supplying the above-described reaction gas are connected to an inlet (gas introduction port) of the shower head 303s. A source gas supply system similar to the source gas supply system of the above-described embodiments is connected to the gas supply port 332a. A reaction gas supply system similar to the reaction gas supply system of the above-described embodiments is connected to the gas supply port 332b. A gas dispersion plate for supplying gas in a shower form into the processing chamber 301 is provided to the outlet (gas discharge outlet) of the shower head 303s. An exhaust port 331 for exhausting the interior of the processing chamber 301 is provided to the processing vessel 303. An exhaust system similar to the exhaust system of the above-described embodiment is connected to the exhaust port 331.

Figure 10:
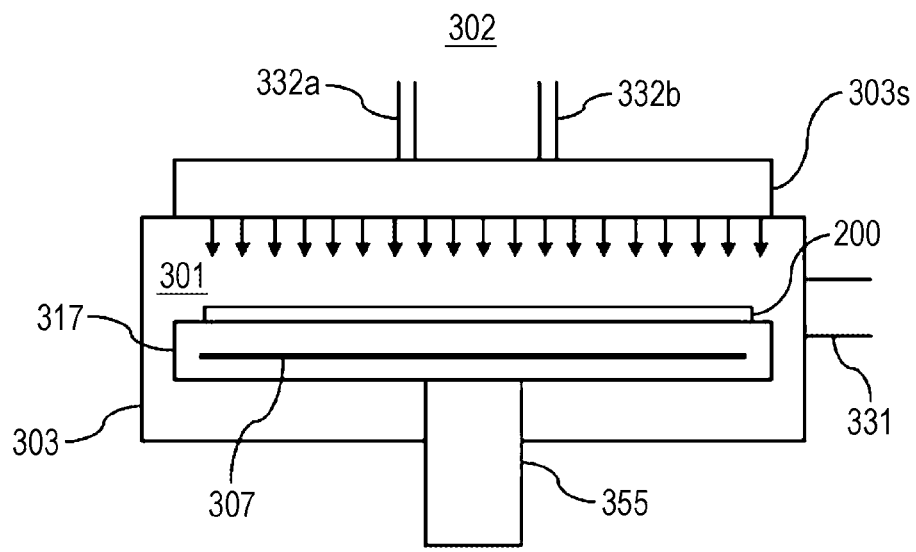
FIG. 10 is a schematic configuration diagram of a processing furnace of a substrate processing apparatus appropriately used in another embodiment of the present disclosure and illustrates a processing furnace portion in a longitudinal sectional view.
Figure 11:
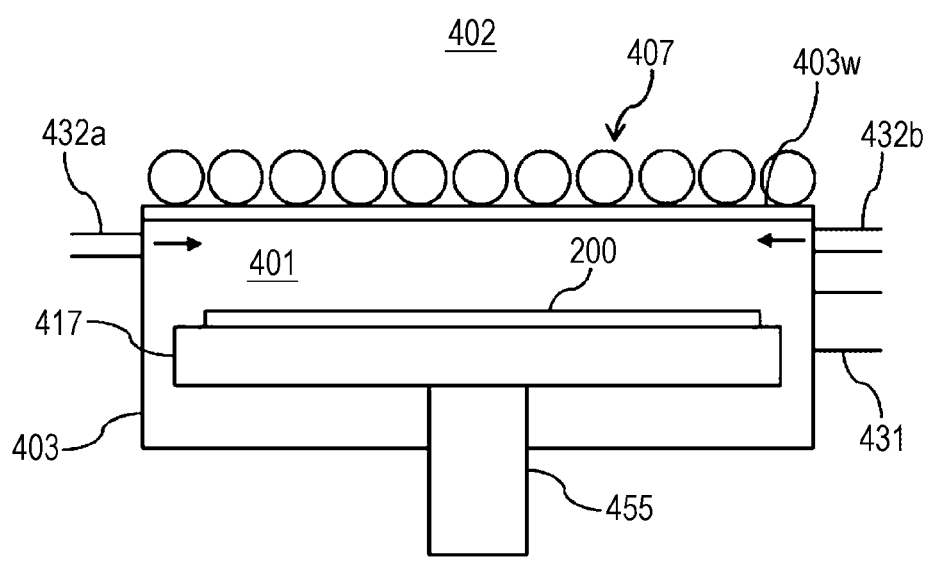
FIG. 11 is a schematic configuration diagram of a processing furnace of a substrate processing apparatus appropriately used in another embodiment of the present disclosure and illustrates a Processing furnace portion in a longitudinal sectional view.

In addition, for example, the present disclosure may also be appropriately applied to the case of forming a film by using a substrate processing apparatus provided with a processing furnace 402 illustrated in FIG. 10. The processing furnace 402 includes a processing vessel 403 constituting a processing chamber 401, a support base 417 for supporting one or several wafers 200 in a horizontal posture, a rotation shaft 455 for supporting the support base 417 from the lower portion, a lamp heater 407 for performing light irradiation toward the wafers 200 in the processing vessel 403, and a quartz window 403w for transmitting light from the lamp heater 407. A gas supply port 432a for supplying the above-described source gas and a gas supply port 432b for supplying the above-described reaction gas are connected to the processing vessel 403. A source gas supply system similar to the source gas supply system of the above-described embodiments is connected to the gas supply port 432a. A reaction gas supply system similar to the reaction gas supply system of the above-described embodiments is connected to the gas supply port 432b. An exhaust port 431 for exhausting the interior of the processing chamber 401 is provided to the processing vessel 403. An exhaust system similar to the exhaust system of the above-described embodiment is connected to the exhaust port 431.

Even in the case of using the substrate processing apparatus, film formation can be performed under the same sequence and processing conditions as those of the above-described embodiment and modified examples.

It is preferable that the process recipe (a program in which the processing procedures, processing conditions, or the like are written) used for forming these various thin films is prepared individually (a plurality of the process recipes are prepared) according to the contents of the substrate processing (film types, composition ratios, film qualities, film thicknesses, processing procedures, processing conditions, and the like). Then, it is preferable that, at the time of starting the substrate processing, an appropriate process recipe is appropriately selected from a plurality of process recipes according to the contents of the substrate processing. More specifically, it is preferable that a plurality of process recipes individually prepared according to the contents of the substrate processing are stored (installed) in advance in the storage device 121c included in the substrate processing apparatus via an electric communication line or a recording medium (external storage device 123) in which the process recipe is recorded. In addition, it is preferable that, at the time of starting the substrate processing, the CPU 121a included in the substrate processing apparatus appropriately selects an appropriate process recipe from the plurality of process recipes stored in the storage device 121c according to the contents of the substrate processing. With such a configuration, it is possible to form thin films having various film types, composition ratios, film qualities, and film thicknesses with a single substrate processing apparatus in a versatile manner with good reproducibility. In addition, it is possible to reduce operator's operational burden (input burden of processing procedures, processing conditions, and the like) and to quickly start the substrate processing while avoiding operation errors.

In addition, the present disclosure may also be realized, for example, by changing a process recipe of an existing substrate processing apparatus. In the case of changing the process recipe, the process recipe according to the present disclosure may be installed in an existing substrate processing apparatus via a telecommunication line or a recording medium in which the process recipe is recorded, or the process recipe itself may be changed into the process recipe according to the present disclosure by operating an input/output device of the existing substrate processing apparatus.

Hereinafter, preferred embodiments of the present disclosure will be supplementarily described.

[Supplement 1]

According to an aspect of the present disclosure, there is provided a method of manufacturing a semiconductor device or a method of processing a substrate, the method including forming a metal carbonitride film containing a metal element, a carbon element, and a nitrogen element on a substrate by performing a predetermined number of times in a time division manner (asynchronously, intermittently, or pulse-wise):

forming a metal nitride layer containing the metal element and the nitrogen element by performing a predetermined number of times in a time division manner (asynchronously, intermittently, or pulse-wise) supplying a halogen-based source gas containing the metal element to the substrate and supplying a reaction gas containing the nitrogen element and reacting with the metal element to the substrate; and forming a metal carbonitride layer containing the metal element, the carbon element, and the nitrogen element by performing a predetermined number of times in a time division manner (asynchronously, intermittently, or pulse-wise) supplying an organic-based source gas containing the metal element and the carbon element to the substrate and supplying the reaction gas to the substrate, wherein a ratio of the number of times of performing the forming of the metal nitride layer and the number of times of performing the forming of the metal carbonitride layer is controlled so that a carbon concentration contained in the metal carbonitride film is set to be 5 to 50%, preferably 5 to 40%, more preferably 5 to 30%.

[Supplement 2]

The method of Supplement 1, wherein the number of times of performing the forming of the metal nitride layer and the number of times of performing the forming of the metal carbonitride layer are controlled so that a film thickness of the metal carbonitride film is set to 5 to 30 nm.

[Supplement 3]

The method according to Supplement 1 or 2, wherein the metal element is titanium.

[Supplement 4]

In any one of the methods described in Supplements 1 to 3, wherein an etching rate is controlled by controlling the carbon concentration contained in the metal carbonitride film.

[Supplement 5]

The method according to Supplement 4, wherein a wet etching rate is decreased by increasing the carbon concentration contained in the metal carbonitride film.

[Supplement 6]

The method according to Supplement 4, wherein the etching rate is increased by decreasing the carbon concentration contained in the metal carbonitride film.

[Supplement 7]

According to another aspect of the disclosure, there is provided a substrate processing apparatus including:

a processing chamber configured to accommodate a substrate;

a gas supply system configured to supply a halogen-based source gas containing a metal element, an organic-based source gas containing the metal element and a carbon element, a reaction gas containing a nitrogen element and reacting with the metal element; and a control portion configured to include a process of, by controlling the gas supply system, forming a metal carbonitride layer containing the metal element, the carbon element, and the nitrogen element on the substrate accommodated in the processing chamber by performing a predetermined number of times in a time division manner (asynchronously, intermittently, or pulse-wise): a process of forming a metal nitride layer containing the metal element and the nitrogen element by performing a predetermined number of times in a time division manner (asynchronously, intermittently, or pulse-wise) a process of supplying the halogen-based source gas to the substrate and a process of supplying the reaction gas to the substrate and a process of forming a metal carbonitride layer containing the metal element, the carbon element, and the nitrogen element by performing a predetermined number of times in a time division manner (asynchronously, intermittently, or pulse-wise) a process of supplying the organic-based source gas to the substrate and a process of supplying the reaction gas to the substrate, wherein a ratio of the number of times of performing the process of forming the metal nitride layer and the number of times of performing the process of forming the metal carbonitride layer is controlled so that a carbon concentration contained in the metal carbonitride film is set to be 5 to 50%, preferably 5 to 40%, more preferably 5 to 30%.

[Supplement 8]

According to still another aspect of the present disclosure, there is provided a program or a non-transitory computer-readable recording medium storing the program for causing a computer to execute a procedure of forming a metal carbonitride film containing a metal element, a carbon element, and a nitrogen element on a substrate by performing a predetermined number of times in a time-divided manner (asynchronously, intermittently, or pulse-wise):
a procedure of forming a metal nitride layer containing the metal element and the nitrogen element by performing a predetermined number of times in a time division manner (asynchronously, intermittently, or pulse-wise) a procedure of supplying a halogen-based source gas containing the metal element to the substrate and a procedure of supplying a reaction gas containing a nitrogen element and reacting with the metal element to the substrate; and
a procedure of forming a metal carbonitride layer containing the metal element, the carbon element, and the nitrogen element by Performing a predetermined number of times in a time division manner (asynchronously, intermittently, or pulse-wise) a procedure of supplying an organic-based source gas containing the metal element and the carbon element to the substrate and a procedure of supplying the reaction gas to the substrate,
wherein a ratio of the number of times of performing the procedure of forming the metal nitride layer and the number of times of performing the procedure of forming the metal carbonitride layer is controlled so that a carbon concentration contained in the metal carbonitride film is set to be 5 to 50%, preferably, 5 to 40%, more preferably 5 to 30%.

INDUSTRIAL APPLICABILITY

As described above, the present disclosure can be used for, for example, a method of manufacturing a semiconductor device, a substrate processing apparatus, a program, and the like.

REFERENCE SIGNS LIST

10 SUBSTRATE PROCESSING APPARATUS
200 WAFER
201 PROCESSING CHAMBER
202 PROCESSING FURNACE

The invention claimed is:
1. A method of manufacturing a semiconductor device, comprising forming a hard mask film on a substrate by performing a cycle comprising:
forming a metal nitride layer containing a metal element selected from a group containing titanium, tantalum, tungsten, cobalt, yttrium, ruthenium, aluminum, hafnium, zirconium, molybdenum and silicon, and containing a nitrogen element by performing a first number of times in a time division manner supplying a halogen-based source gas containing the metal element to the substrate and supplying a reaction gas containing the nitrogen element and reacting with the metal element to the substrate; and
forming a metal carbonitride layer containing the metal element, a carbon element, and the nitrogen element by performing a second number of times in a time division manner supplying an organic-based source gas containing the metal element and the carbon element to the substrate and supplying the reaction gas to the substrate,
wherein the cycle is repeated a third number of times to form the hard mask film, being laminated with the metal nitride layer and the metal carbonitride layer,
wherein a ratio of the first number of times and the second number of times is controlled so that a carbon concentration contained in the hard mask film is 5% to 50%,
wherein a rate of a halide based dry etching is controlled by controlling the carbon concentration contained in the metal carbonitride film, and
wherein, after the forming of the metal carbonitride layer is first performed, the forming of the metal nitride layer is performed.
2. The method according to claim 1, wherein the metal element is titanium.
3. The method according to claim 1, wherein the rate of the halide based dry etching is decreased by increasing the carbon concentration contained in the metal carbonitride film.
4. The method according to claim 1, wherein the rate of the halide based dry etching is increased by decreasing the carbon concentration contained in the metal carbonitride film.
5. A non-transitory computer-readable recording medium storing a program to be executed by a substrate processing apparatus for causing a computer to execute a procedure of forming a hard mask film on a substrate accommodated in a processing chamber of the substrate processing apparatus by performing a cycle comprising:
a procedure of forming a metal nitride layer containing a metal element selected from a group containing titanium, tantalum, tungsten, cobalt, yttrium, ruthenium, aluminum, hafnium, zirconium, molybdenum and silicon, and containing a nitrogen element by performing a first number of times in a time division manner a procedure of supplying a halogen-based source gas containing the metal element to the substrate and a procedure of supplying a reaction gas containing a nitrogen element and reacting with the metal element to the substrate; and
a procedure of forming a metal carbonitride layer containing the metal element, a carbon element, and the nitrogen element by performing a second number of times in a time division manner a procedure of supplying an organic source gas containing the metal element and the carbon element to the substrate and a procedure of supplying the reaction gas to the substrate,
wherein the cycle is repeated a third number of times to the hard mask film, being laminated with the metal nitride layer and the metal carbonitride layer,
wherein a ratio of the first number of times and the second number of times is controlled so that a carbon concentration contained in the hard mask film is 5% to 50%,
wherein a rate of a halide based dry etching is controlled by controlling the carbon concentration contained in the metal carbonitride film, and
wherein, after the forming of the metal carbonitride layer is first performed, the forming of the metal nitride layer is performed.

* * * * *